United States Patent
Dannels et al.

(10) Patent No.: US 10,852,382 B2
(45) Date of Patent: Dec. 1, 2020

(54) CORRECTING RESIDUAL ALIASING IN ACCELERATED MAGNETIC RESONANCE IMAGING

(71) Applicant: Canon Medical Systems Corporation, Tochigi (JP)

(72) Inventors: Wayne R. Dannels, Mentor, OH (US); Anuj Sharma, Hudson, OH (US)

(73) Assignee: Canon Medical Systems Corporation, Tochigi (JP)

(*) Notice: Subject to any disclaimer, the term of this patent is extended or adjusted under 35 U.S.C. 154(b) by 176 days.

(21) Appl. No.: 16/022,348

(22) Filed: Jun. 28, 2018

(65) Prior Publication Data

US 2020/0003859 A1    Jan. 2, 2020

(51) Int. Cl.
| | |
|---|---|
| *G01R 33/565* | (2006.01) |
| *G01R 33/483* | (2006.01) |
| *G06T 11/00* | (2006.01) |
| *G06T 7/00* | (2017.01) |
| *G01R 33/561* | (2006.01) |

(52) U.S. Cl.
CPC ... *G01R 33/56545* (2013.01); *G01R 33/4835* (2013.01); *G01R 33/5611* (2013.01); *G06T 7/0012* (2013.01); *G06T 11/006* (2013.01); *G06T 2207/10088* (2013.01)

(58) Field of Classification Search
CPC .......... G01R 33/56545; G01R 33/5611; G01R 33/4835; G06T 7/0012; G06T 11/006; G06T 2207/10088
USPC ....................................................... 382/131
See application file for complete search history.

(56) References Cited

U.S. PATENT DOCUMENTS

| | | | |
|---|---|---|---|
| 2003/0206648 A1* | 11/2003 | King | G01R 33/5611 382/128 |
| 2005/0270024 A1* | 12/2005 | Lin | G01R 33/5611 324/307 |
| 2019/0170842 A1 | 6/2019 | Sharma | |

OTHER PUBLICATIONS

Park et al., "SMS-HSL: Simultaneous Multislice Aliasing Separation Exploiting Hankel Subspace Learning", Magnetic Resonance in Medicine 00:00-00 (2016), pp. 1-13.

Cauley et al., "Interslice Leakage Artiface Reduction Technique for Simultaneous Multislice Acquisitions", Magnetic Resonance in Medicine 72:93-102 (2014), pp. 93-102.

(Continued)

*Primary Examiner* — Ayodeji O Ayotunde
(74) *Attorney, Agent, or Firm* — Nixon & Vanderhye, P.C.

(57) ABSTRACT

Magnetic resonance imaging (MRI) systems and methods to determine and/or correct slice leakage and/or residual aliasing in the image domain in accelerated MRI imaging. Some implementations process one slice of MRI image domain data by input to a sensitivity encoding (SENSE) un-aliasing matrix built from predetermined RF signal reception sensitivity maps, thereby producing SENSE-decoded MRI image domain data for one pass-through image slice and at least one extra slice, and determine inter-slice leakage and/or in-plane residual aliasing based on content of the at least one extra output slice from the SENSE-decoded MRI image domain data. Some implementations correct slice leakage in reconstructed images by generating a fractional leakage matrix of inter-slice leakage measurements, and by multiplying the inverted fractional leakage matrix with uncorrected reconstructed images.

20 Claims, 12 Drawing Sheets

(56) References Cited

OTHER PUBLICATIONS

Moeller et al., "Signal Leakage (L-factor) as a Measure for Parallel Imaging Perforamcne Among Simultaneously Multi-Slice (SMS) Excited and Acquired Signals", Proc. Intl. Soc. Mag. Reson. Med. 20 (2012), p. 519.

Todd et al., "Evaluation of 2D Multiband EPI imaging for high-resolution, whole-brain, task-based fMRI studies at 3T: Sensitivity and slice leakage artifacts"; NeuroImage 124 (2016) 32-42.

J. Xu et al., "Evaluation of Slice Accelerations Using Multiband Echo Planar Imaging at 3 T", NeuroImage 83 (2013), pp. 991-1001.

J. Xu et al., "Evaluation of Slice Accelerations Using Multiband Echo Planar Imaging at 3 Tesla", Neuroimage, Dec. 2013; pp. 1-27.

Barth, Markus et al., Simultaneous Multislice (SMS) Imaging Techniques, Mag. Reso. In Med., 00:00-00, pp. 1-19 (2015).

Larkman, David J. et al., Use of Multicoil Arrays for Separation of Signal from Multiple Slices Simultaneously Excited, Jnl. of Mag. Reso. Imag., 13:313-317 (2001).

Pruessmann, Klaas P. et al., "SENSE: Sensitivity Encoding for Fast MRI", Magnetic Resonance in Medicine, vol. 42, 199, pp. 952-962.

Setsompop, Kawin et al., Blipped-Controlled Aliasing in Parallel Imaging for Simultaneous Multislice Echo Planar Imaging With Reduced g-Factor Penalty, Mag. Reso. In Med., 67:1210-1224 (2012).

\* cited by examiner

CORRECTING RESIDUAL ALIASING IN ACCELERATED MAGNETIC RESONANCE IMAGING

CROSS REFERENCE TO RELATED APPLICATIONS

This application is related to U.S. patent application Ser. No. 15/829,393 filed on Dec. 1, 2017, which is hereby incorporated by reference in its entirety.

TECHNICAL FIELD

The subject matter below relates generally to magnetic resonance imaging (MRI), and more particularly to systems and methods for determining and/or correcting inter-slice leakage and/or residual aliasing in accelerated imaging.

DETAILED DESCRIPTION

Example embodiments of the subject matter disclosed herein provide for determining and/or correcting inter-slice leakage artifacts in MR images generated from multi-slice imaging techniques such as, but not limited to, Simultaneous Multi-slice imaging (SMS), and, without loss of generality, in-plane accelerated imaging referred to as Sensitivity Encoding (SENSE) or a combination thereof. In simultaneous multi-slice MR image acquisition, signal contribution from one slice may be demultiplexed into output images of a plurality of slices thus causing artifacts in the respective single slice images. In contrast to existing leakage identification techniques for multi-slice imaging, some example embodiments provide for spatially identifying and/or measuring such leakage in the image domain. Moreover, in contrast to existing leakage correction techniques for multi-slice imaging, some example embodiments provide for actively removing slice leakage using image-based reconstruction.

Figure 1:
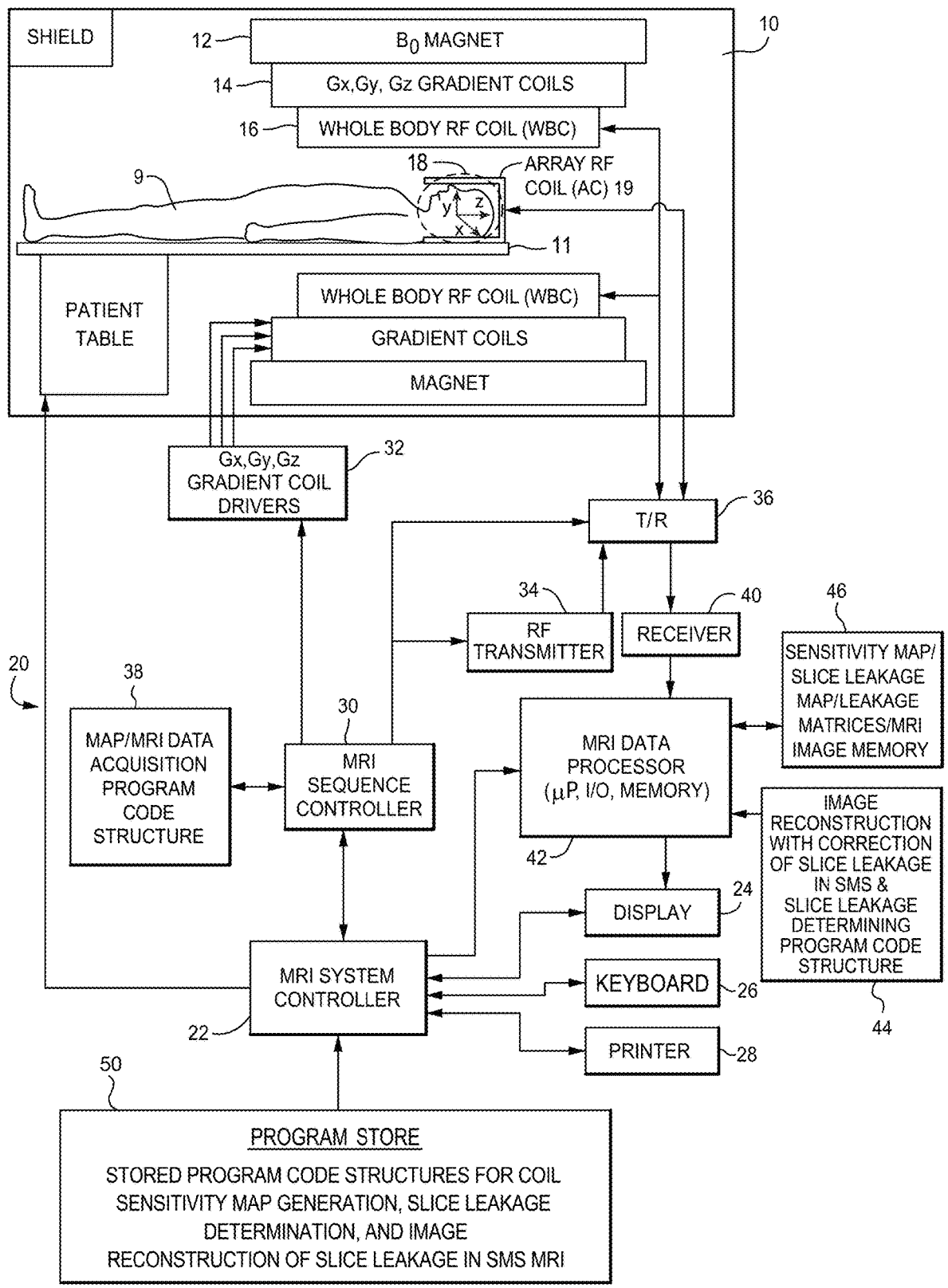
FIG. 1 is a high-level schematic block diagram of an MRI system adapted for acquiring images using multi-slice imaging and determining and/or correcting inter-slice leakage and/or residual aliasing, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body radio frequency (RF) coil (WBC) assembly 16. Along the horizontal axis of this cylindrical array of elements is an imaging volume 18 shown as substantially encompassing the anatomy of interest (i.e., region of interest or "ROI") for a patient 9 supported by a patient table 11.

In some embodiments, a smaller array RF coil 19 might be coupled to a portion of the patient such that the imaging volume would include the area encompassed by the smaller array RF coil. As those skilled in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and one or more receiver coils configured to receive RF signals from the imaging volume.

An MRI system controller 22 has input/output ports connected to a display 24, keyboard 26 and printer 28. As will be appreciated, the display 24 may be of the touchscreen variety so that it provides control inputs as well.

The MRI system controller 22, or a computer coupled to the MRI system controller 22, may be operated to provide the MRI sequence controller 30 information about a pulse sequence and/or to manage the operations of the entire system, according to installed software programs. The MRI system controller 22 may also serve as an element for instructing a patient to perform tasks, such as, for example, a breath hold by a voice message produced using an automatic voice synthesis technique.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques, and for generating coil sensitivity maps etc. The MR imaging techniques may include, for example, parallel imaging and/or other imaging sequences. Example parallel imaging techniques that may be controlled by system controller 22 may include SMS, in-plane accelerated imaging and a combination thereof. The implementation of MR imaging may include obtaining prescan and/or lower resolution MR images in addition to the images obtained by a diagnostic scan.

The pulse-sequence information includes information required for operating the Gx, Gy and Gz gradient coil drivers 32, as well as the RF transmitter 34 and the transmit/receive switch 36 (if the same RF coil is used for both transmission and reception) according to a pulse sequence. Such information includes the strength, duration, shape, and application timing of pulsed currents applied to the x-, y-, and z-coils. The transmission of pulse sequences, duty cycle etc. may be controlled by the MRI system controller 22, MRI sequence controller 30, and/or MRI data processor 42 based on, for example, program code for signal acquisition pattern for a single slice or a signal acquisition pattern such as, for example, multi-slice acquisition such as, but not limited to, SMS, in-plane accelerated imaging or a combination of SMS and in-plane accelerated imaging.

The MRI system 20 includes an RF receiver 40 providing input to data processor 42 so as to create processed image data, which is sent to display 24. The MRI data processor 42 is also configured for access to memory 46, program code structures 44 and program/data store 50. Memory 46 may include system configuration parameters, coil sensitivity maps, un-aliasing matrices, inter-slice leakage maps, slice leakage matrices, and other program structures. MRI program code structures 44 and 50 may, in addition to control logic for reconstructing MRI images, form coil sensitivity maps, generate inter-slice leakage maps, generate slice leakage matrices, and/or provide for use of generated inter-slice leakage maps/matrices in reducing artifacts in MRI images, and may also include control logic to obtain MR data from RF coils 16 and/or any other receive coils. Processes such as, for example, processes 900, 1000 and 1400 described below in relation to FIGS. 9, 10 and 14, respectively, can be performed by the MRI system controller 22, MRI sequence controller 30, and/or MRI data processor 42.

Although shown in FIG. 1 as being located away from the RF coil 16, in some embodiments, any of RF transmitter 34, transmit/receive switch 36, and RF receiver 40 may be located in close proximity to, or on a surface of, the RF coils 16 and/or other RF coil.

Also illustrated in FIG. 1 is a generalized depiction of an MRI system program/data store 50 where stored program code structures (e.g., for controlling data acquisition according to simultaneous multi-slice scan techniques, for improved image reconstruction with reduced or eliminated inter-slice leakage, for defining graphical user interfaces (GUI), accepting operator inputs), and configured or predetermined data (e.g., certain threshold settings for controlling program execution, parameters for controlling the estimation of coil sensitivity and image reconstruction) are stored in non-transitory computer-readable storage media accessible to the various data processing components of the MRI system. As those skilled in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those skilled in the art will appreciate, the FIG. 1 depiction is a very high-level simplified diagram of a typical MRI system with some modifications so as to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process, an inter-slice leakage map generation process, slice leakage matrix creation/inversion process and/or sometimes a coil sensitivity map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

Simultaneous multi-slice (SMS) imaging is a technique used for accelerating MR scans. Many techniques are practiced in MR imaging to speed up the acquisition process. Quicker acquisition of MRI images leads to improved comfort for the imaging subject (e.g. patient), and more accurate images due to reduction of artifacts caused by patient movement and the like.

In SMS, scan time reduction is achieved by simultaneously exciting multiple slices in an ROI, using multiband radio frequency (RF) pulses and acquiring data using a 2D phase encoded readout. SMS is described in Barth et al, "Simultaneous Multislice (SMS) imaging techniques", MRM 75:63-81, 2016, which is hereby incorporated by reference in its entirety.

Some acceleration techniques, such as in-plane parallel imaging, suffer from signal-to-noise ratio (SNR) reduction proportional to the square root of the acceleration factor ($\sqrt{R}$) because the number of acquired k-space samples is reduced by the factor R. SMS does not suffer this penalty because the number of excitations is increased by the multiband factor. The multiband factor (MB) is the number of slices which are simultaneously excited and from which MR signals are simultaneously acquired. The multiband factor is also referred to as acceleration in the slice direction.

In SMS, SNR routinely may be proportional to the ratio $\sqrt{MB}/\sqrt{R}$. However, in SMS, MB is equal to R. Therefore, in SMS, SNR does not reduce proportionately to $\sqrt{R}$.

This characteristic provides SMS with a significant advantage over other MR image acquisition techniques for simultaneous acquisition of slices. However, both SMS and in-plane parallel imaging suffer SNR loss at high acceleration factors due to coil-geometry constraints. This reduction in SNR due to coil geometry is called the geometry-factor penalty or more commonly as the g-factor penalty. G-factor can be thought of as a noise-amplification factor. For a given receive coil setup, higher noise can be expected in regions of the reconstructed image with high g-factor map values.

In the SMS image data obtained by accelerated MR acquisition, the slices (from different spatial locations) overlap each other. When there is not sufficient variation in receive coil sensitivity between the simultaneously acquired slices, the SNR of the reconstructed slice images will be low due to the increased g-factor penalty. The SNR can be improved by shifting the slices with respect to each other in the phase encode (PE) direction at the time of acquisition using a method such as the blipped-CAIPI technique (see Setsompop et al, "Blipped-controlled aliasing in parallel imaging for simultaneous multislice echo planar imaging with reduced g-factor penalty", MRM 67:1210-1224, 2012). As described in Setsompop et al., blipped-CAIPI exploits the in-plane variation of sensitivity in conventional receive coils designed for in-plane acceleration. The PE shift causes voxels in one slice to alias with voxels in one or more other slices that have sufficiently orthogonal receive sensitivity values. This reduces the relatively high g-factor penalty associated with un-aliasing simultaneously acquired closely spaced slices.

The simultaneously acquired slices are separated in reconstruction using parallel imaging techniques such as, but not limited to, SENSE. SENSE is a technique performed in the image domain after data from individual coils is Fourier transformed to the image space. One of the ways in which SMS images can be reconstructed is by utilizing the SENSE framework. In SMS, the SENSE un-aliasing matrix is set up using pre-determined receive coil sensitivity data from the acquired slice locations. Matrix algebra operations are utilized to obtain the un-aliased single-slice image voxel intensity values by multiplying the un-aliasing matrix with the vector of acquired aliased image voxel intensity values from each receive coil. The PE shifts can be included in the reconstruction by shifting the receive coil sensitivity maps. In essence, the concept of conventional SENSE is extended in the slice direction to reconstruct SMS images.

Conceptually, the SENSE reconstruction operates as a band separator on multiband MR images. It takes in a multiband image and separates it into single-band images. That is, SENSE takes as input a single multiband image generated based on the MR signals received at the receive coils from a plurality of the excited slices, and, using coil sensitivity maps, determines and/or generates a coil-combined image for each of the excited slices from which MR signals were received.

SENSE can be used to reconstruct single slice images from multiband images generated from parallel imaging techniques, such as, SMS and in-plane parallel imaging. For purposes of this disclosure, in response to an input SMS image or single-slice image, SENSE reconstruction and SMS reconstruction operate in the same manner.

Figure 2:
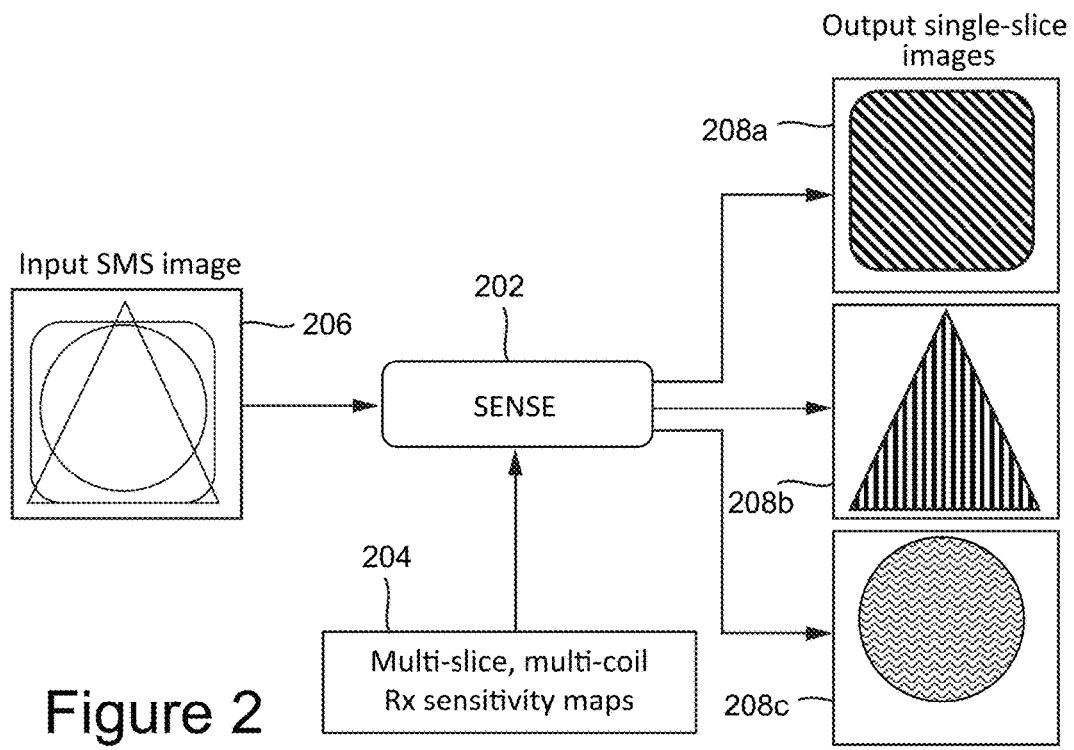
FIG. 2 is a schematic illustration of ideal outputs obtained from a portion of a reconstruction process in accordance with Simultaneous Multi-Slice Imaging (SMS) using Sensitivity Encoding (SENSE), according to conventional techniques.

FIG. 2 schematically illustrates the operation of an example SENSE reconstruction module 202, which results in an ideal output. The SENSE module 202 is provided with access to multi-slice, multi-coil receive sensitivity maps 204 for a volume including the ROI. An SMS image 206, acquired by simultaneously exciting three slices in the ROI, is input to the SENSE module 202. The input image 206 is a SMS 3× (i.e., acquired with SMS multiband factor of 3) multiband image. In practice, the input comprises multiband images obtained from all the receive channels of a phased array coil. For clarity of illustration, FIG. 2 shows only one input image. The SENSE module 202, outputs a respective coil-combined image (208a-208c) for each of the three slices. As illustrated, whereas the input image was a composite of the images of slices 1-3, the output images include a separate image for each slice. In the ideal operation, as illustrated in FIG. 2, each slice image contains an image reconstructed only from MR signals emitted by that slice. Thus, in the ideal operation scenario illustrated in FIG. 2, whereas the input image 206 is a composite of a rectangle, triangle and a circle, contributed by respective slices in the ROI, the output images 208a-208c each comprises only one of the rectangle, triangle or circle.

Figure 3:
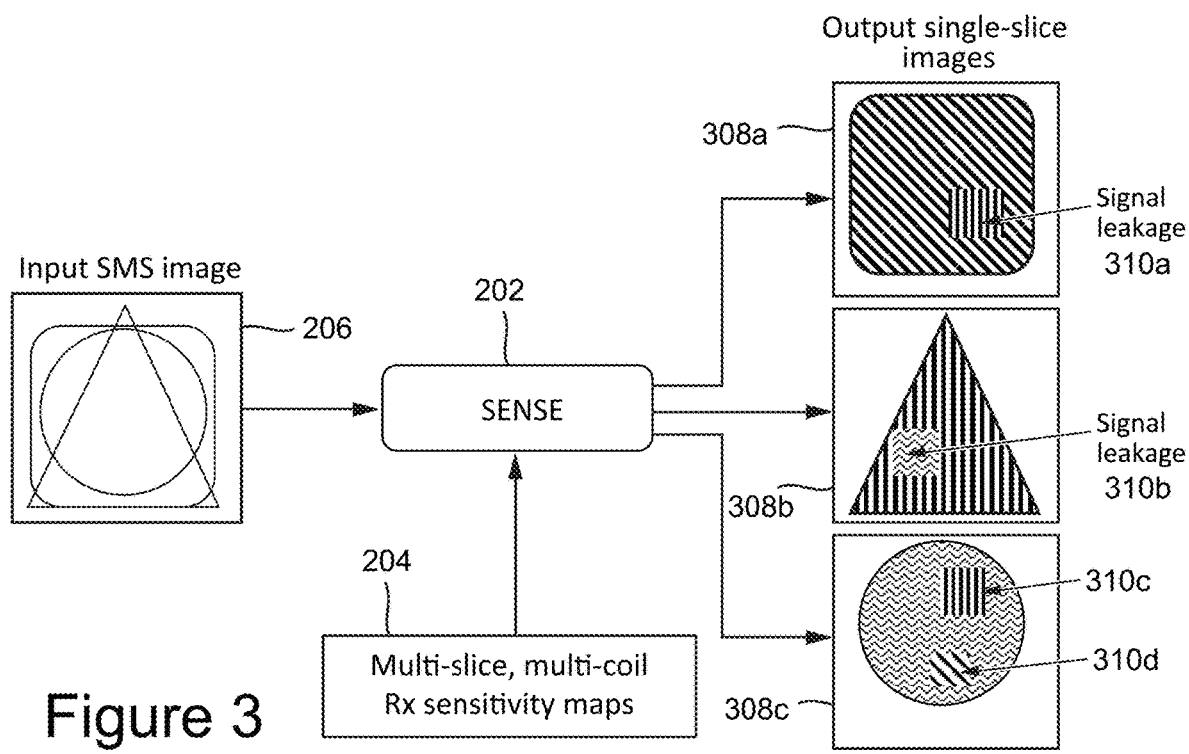
FIG. 3 is a schematic illustration of outputs affected by inter-slice leakage, obtained from a portion of a reconstruction process in accordance with SMS or SENSE according to conventional techniques.

Whereas FIG. 2 schematically illustrates an ideal output scenario of the SENSE reconstruction module 202, FIG. 3 schematically illustrates what often occurs in practice when SENSE 202 is used on input images such as input image 206. Output images 308a-308c each include, in addition to the respective shape (rectangle, triangle and circle) that represents the image corresponding to MR signals received from a particular slice, an artifact (e.g., artifacts 310a, 310b, 310c, 310d) that is caused by MR signal leakage from a different slice. As shown, the artifact 310a in the rectangle image is due to signal leakage from the triangle image, artifact 310b in the triangle image is due to signal leakage from the circle image, and artifacts 310c and 310d in the circle image are signal leakage from the triangle and rectangle images, respectively.

The non-ideal SENSE reconstruction is due, at least in part, to inaccuracies of coil sensitivity maps that are provided to the SENSE module 202. The inaccuracies lead to slice leakage artifacts which are image intensities from one slice showing up in another slice.

Figure 4:
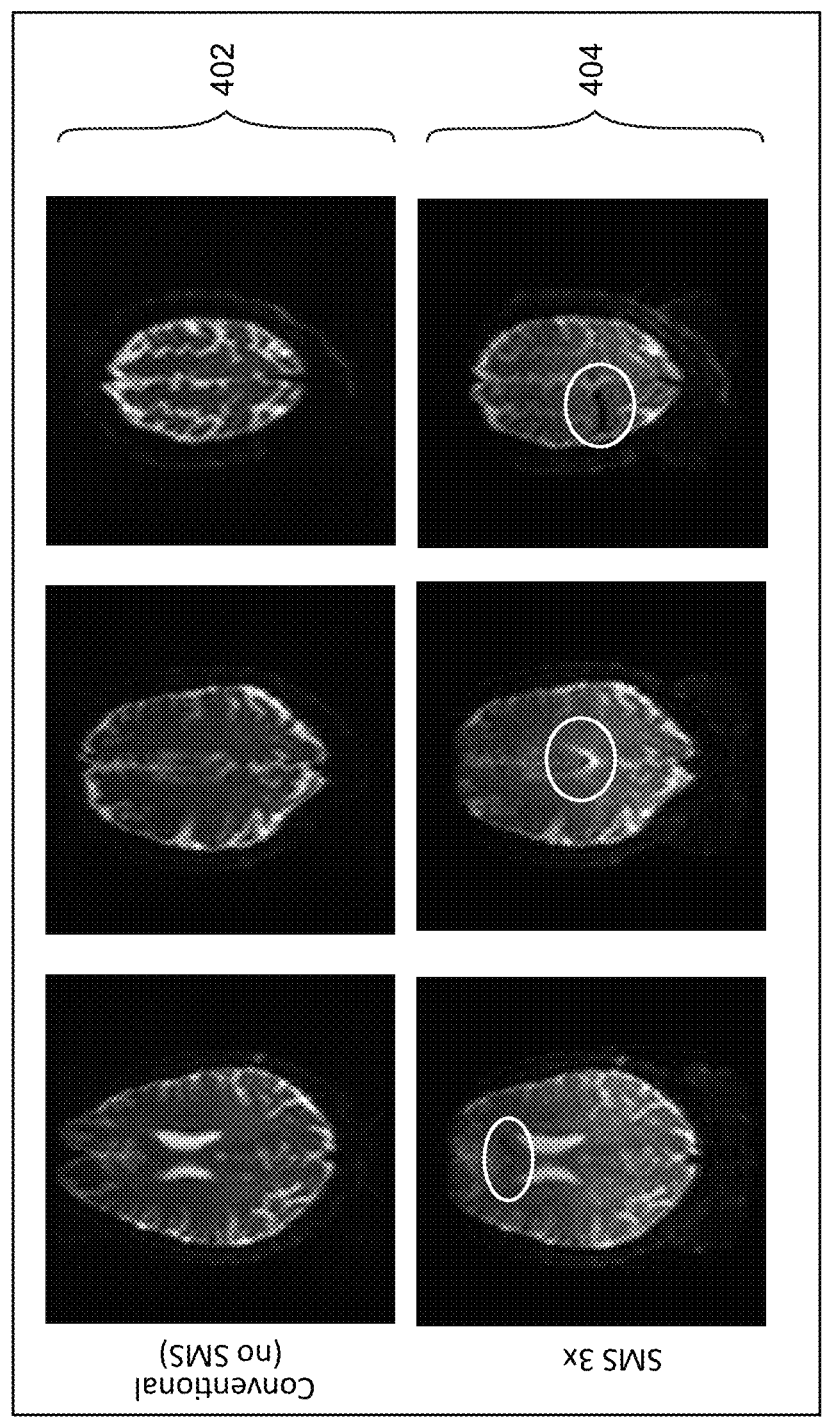
FIG. 4 illustrates example effects of artifacts that are visible in MRI images obtained using SMS imaging.

Leakage artifacts are very common and easily reproducible. Leakage artifacts may appear as incoherent, sharp edges that are highly localized and asymmetric. FIG. 4 shows example slice leakage artifacts in images 404 acquired using SMS 3× Echo Planar Imaging (EPI) as compared to conventional multi-slice EPI (images 402). Inter-slice leakage artifacts are usually more difficult to detect in an MR image, than many other types of artifacts. At least part of the reason for this disparity in the level of difficulty in detecting is due to the highly localized appearance of inter-slice artifacts, in contrast to the relatively distributed appearance and regular patterns exhibited by other artifacts. As illustrated in FIG. 4, inter-slice leakage is typically very localized and may be difficult to identify separately from pathologies. As illustrated in the areas within marked circles in FIG. 4, inter-slice leakage can lead to substantial artifacts in MR images. Leaked signal in SMS may be misread by a radiologist (or other user/operator who uses MR images) as lesion, stroke or other pathologic features.

Embodiments provide improved techniques of determining inter-slice leakage in SMS, in-plane parallel imaging or some combination thereof. Some embodiments provide for obtaining a high reliability answer for questions such as "Is that unidentified bright object real or a slice leakage artifact?"

One conventional technique for determining inter-slice leakage is the Monte Carlo approach that is described in Moeller et al, "Signal leakage (L-factor) as a measure of parallel imaging performance among simultaneously multislice (SMS) excited and acquired signals", Proc Intl Soc Magn Reson Med (ISMRM) 20, 2012. In it, low frequency signals are introduced into single-slice images and combined to synthesize SMS images. SMS images are then un-aliased. Frequency analysis of un-aliased slices may be used to reveal how much signal from one slice leaked into another.

Another conventional technique, the Slice-GRAPPA (k-space) technique, is described in Cauley et al, "Interslice leakage artifact reduction technique for simultaneous multislice acquisitions", MRM 72:93-102, 2014. In this approach, the Slice-GRAPPA kernel is calibrated for the given simultaneously acquired slices. The calibration kernels are then applied to single-slice images. The resulting images yield pass-through and leaked signals.

Conventional techniques to estimate slice leakage maps such as the Monte Carlo approach and the slice GRAPPA approach described above reconstruct single slice images by manipulating received MR signal information in the frequency-space and k-space domain. Some example embodiments disclosed herein include an image domain parallel imaging technique to identify inter-slice leakage.

One basis for appreciating example embodiments is to understand that SMS and/or SENSE operates like a spatial band separator (e.g., the capability to separate images for spatially displaced individual slices) and that this can be exploited to determine inter-slice leakage in multi-slice imaging.

Slice leakage occurs in image regions where SENSE reconstruction fails to accurately separate the frequency bands in an SMS multiband image. Then, if a single-slice image is input, SENSE reconstruction should just pass through that image, and all other output slices can be considered to be in stop bands which should have zero intensity. Any non-zero image intensity in a stop band slice is slice leakage.

Figure 5:
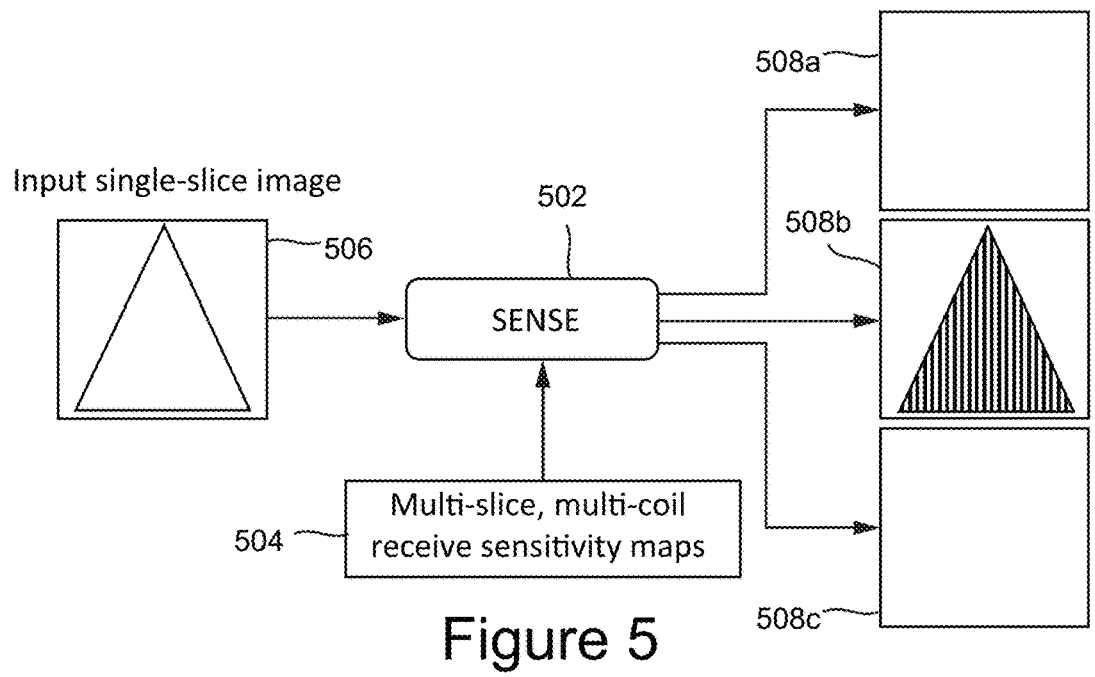
FIG. 5 is a schematic illustration of ideal outputs obtained from a portion of a reconstruction process in accordance with SMS or SENSE according to some example embodiments.

FIG. 5 illustrates passing a single-slice image 506 through the SENSE reconstruction module 502. A single-slice image, such as input image 506, is different from what is referred to as an SMS image. Whereas an SMS image includes a composite of MR signals from several slices, a single-slice image is intended to include only MR signals from one slice.

In module 502, forming of SENSE un-aliasing matrices for the SMS image is performed using predetermined multi-slice multi-coil receive sensitivity maps 504, and the generation of output images is performed based on the input image and the SENSE un-aliasing matrix. In some embodiments, no changes are required to be made to the SENSE reconstruction to notify the processing that instead of a SMS image being supplied as input, a single-slice image is being provided. Basically, the processing associated with SENSE reconstruction for a single-slice input image can remain identical to the SENSE reconstruction for a SMS image. Further details of SENSE reconstruction processing are described in relation to FIG. 9.

According to example embodiments, the SENSE un-aliasing matrix is set up to un-alias MR images acquired by a SMS MRI data acquisition sequence so that when the MR slice image data is input to the matrix, a pass-through slice image and one or more extra slice images are produced. Slice leakage from an input slice to another slice of the ROI may be determined based on content of the extra slice images.

The output images 508a-508c represent an ideal situation in which SENSE reconstruction matrix 502 would pass through the single-slice image to its band (e.g., to a pass-through band), and all other bands, called stop bands, would have zero image intensity.

In this example, SENSE reconstruction processing separates the triangle image, which is in the input single-slice image, into its own band while bands assigned for the rectangle and circle receive zeros. This would be the result, for example, when the input single-slice image only includes MR signals from the selected slice.

This process can be repeated for each slice in the ROI in order to obtain the reconstructed image for each slice.

Figure 6:
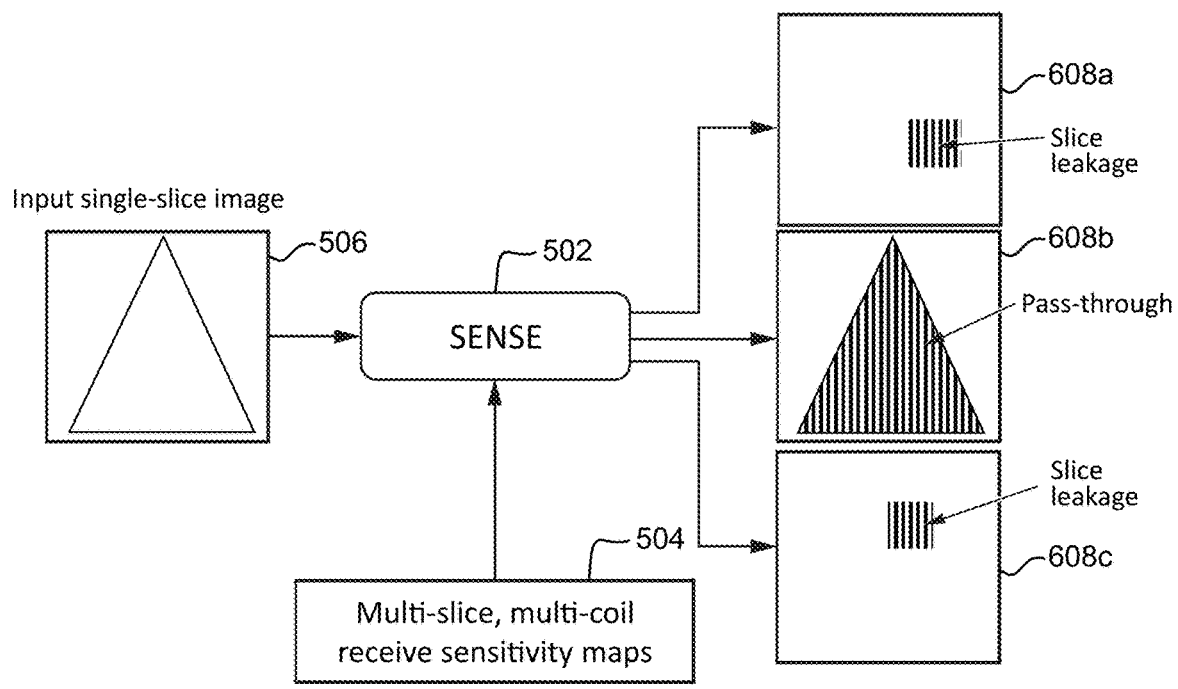
FIG. 6 is a schematic illustration of outputs affected by inter-slice leakage, obtained from a portion of a reconstruction process in accordance with SMS or SENSE according to some example embodiments.

FIG. 6 illustrates that when SENSE reconstruction is non-ideal, slice leakage may be seen in one or more stop bands. In this example, a single-slice triangle image 506 is passed through by the SENSE reconstruction module 502, using multi-coil multi-slice receive sensitivity maps, to its corresponding band image 608b. But some voxels from the triangle in the input image have leaked into the stop bands and are shown as non-zero image intensities in output images 608a and 608c. In the embodiments associated with FIGS. 5-6, each band, as referred to in this document, corresponds to a respective slice in the patient's anatomy. The SENSE output images, other than the output image corresponding to the input single-slice image's band, are the slice leakage images.

Figure 7:
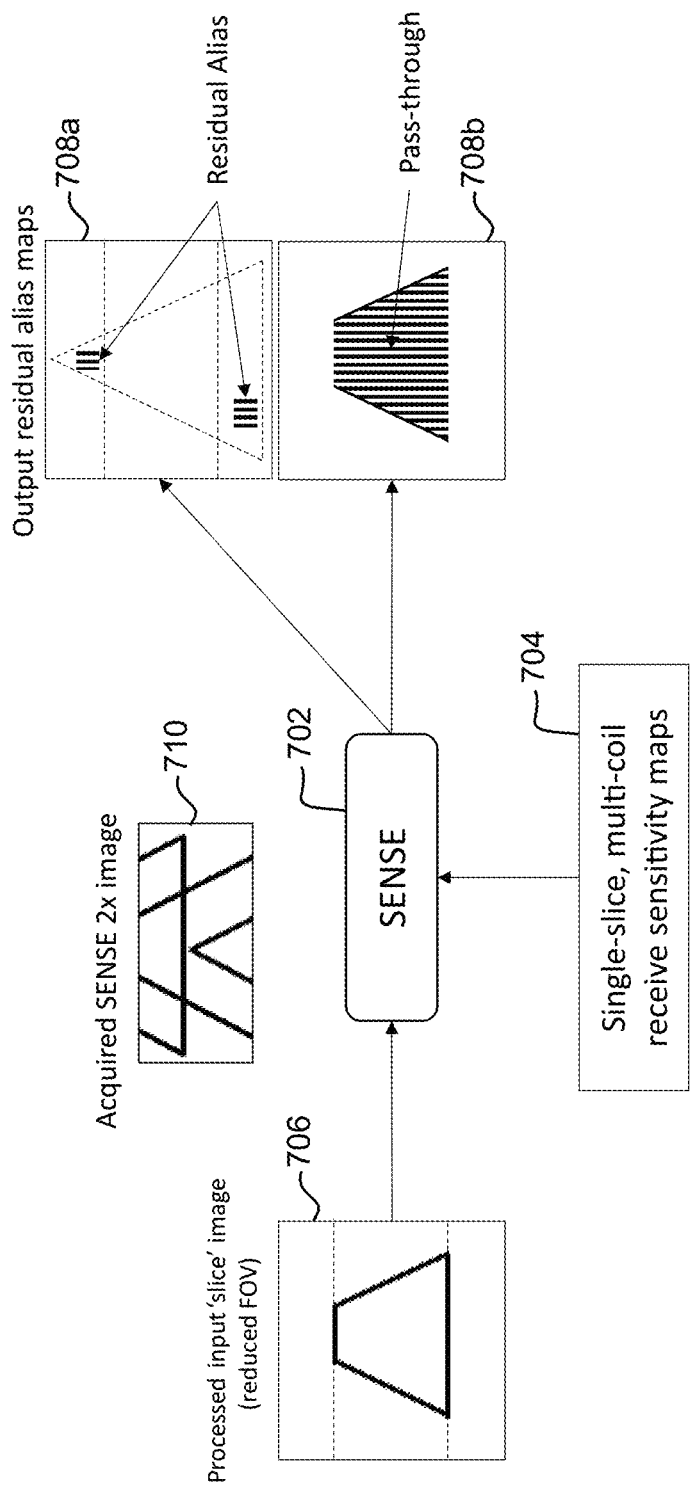
FIG. 7 is a schematic illustration of outputs affected by inter-slice leakage, obtained from a portion of a reconstruction process in accordance with SENSE without SMS according to some example embodiments.

FIG. 7 illustrates an extension of the techniques described above in relation to SMS imaging, to in-plane accelerated imaging without SMS. Example embodiments provide for determining and/or processing residual aliasing in in-plane accelerated imaging images by operating on residual aliasing in the in-plane accelerated imaging images like slice leakage in SMS images. More specifically, in the embodiments associated with FIG. 7, the reduced FOV (field of view) image and aliases can be treated like "slices" described in relation to the SMS embodiments associated with FIGS. 5 and 6. Put another way, in embodiments with in-plane accelerated imaging and no SMS, given an input image having a reduced FOV, the SENSE reconstruction module outputs an image in the pass-through band and one or more other images having residual alias signals in the stop bands.

Consider an in-plane accelerated imaging image 710 acquired with 2× acceleration. For an acceleration factor of 2, k-space lines are acquired at twice the step size of k-space for a full FOV acquisition, resulting in a ½-FOV image 710 being acquired from each coil. The ½-FOV image contains aliasing which includes a portion of the outer part of the triangle that is wrapped around, or aliased, onto the middle region of the triangle. If the SENSE reconstruction is unable to completely separate the middle region from the aliased regions, residual aliasing will be seen in the reconstructed images.

The amount of residual aliasing can be computed by making "slice" leakage maps. Full FOV images without any aliasing are acquired. Such an image is represented by 506 in FIG. 5. A processed reduced FOV image 706 is then derived from the full FOV image. The derived reduced FOV image is supplied as input to the SENSE reconstruction processing 702. In some embodiments, the SENSE reconstruction processing 702 processing logic may be the same as the SENSE reconstruction logic in reconstruction module 502. The coil sensitivity maps 704 provided as input to the SENSE module 702, include at least single-slice multi-coil receive sensitivity maps. That is, coil sensitivity maps 704 include at least the coil sensitivity maps for each of the slices represented in the input "slice" images. If the input reduced FOV images (e.g., shown processed image 706 and the corresponding alias) being input to the SENSE reconstruction module 702 are images of one slice of the patient anatomy, then sensitivity maps for that slice suffice. The sensitivity maps for that single slice will include the sensitivity information that relates to both the pass-through image and the aliases.

The process proceeds by inputting each "slice", e.g., the reduced FOV image (e.g., such as the shown image 706) and each alias, to in-plane accelerated imaging reconstruction module 702 and determining leakage in other "slices". The SENSE reconstruction module 702 operates in the same manner as the SENSE module 502. The operation of the SENSE module 702 is further described in relation to FIG. 9 below.

Each input image may be obtained by processing the acquired full FOV image to separate (e.g., by cropping an area automatically based on preconfigured parameters) the portion of the image in a restricted field of view (e.g., the portion of the FOV indicated by the area between the two dashed lines in image 706) from the rest of the image. The acceleration factor and FOV being known, it is straightforward to compute which areas of the image form the main part and the aliases. Since an acceleration factor of R results in R aliases, for in-plane accelerated imaging with R acceleration, the above processing may be repeated for all R aliases.

In embodiments associated with in-plane parallel imaging, such as that shown in FIG. 7, the SENSE un-aliasing matrix in the in-plane accelerated imaging un-aliasing module is set up to un-alias MR images acquired from a reduced FOV so that when the MR slice image data is input to the matrix a plurality of "slice" images are produced. One of the output "slice" images outputs the pass-through image in the reduced FOV. At least one extra slice image in the output from the un-aliasing matrix represents an enlarged FOV. Then, residual alias content in the reduced FOV slice image is determined based on content of enlarged portions of the extra slice images output from the matrix.

That is, in the embodiment associated with FIG. 7, the result of inputting reduced FOV image 706 to the SENSE reconstruction module 702, is the pass-through image 708b and another "slice" image 708a that contains the residual aliasing. As can be observed in 708a, each of the aliased regions (e.g., to the top and bottom of the region in which the pass though signal is in in 708b) includes residual alias.

Figure 8:
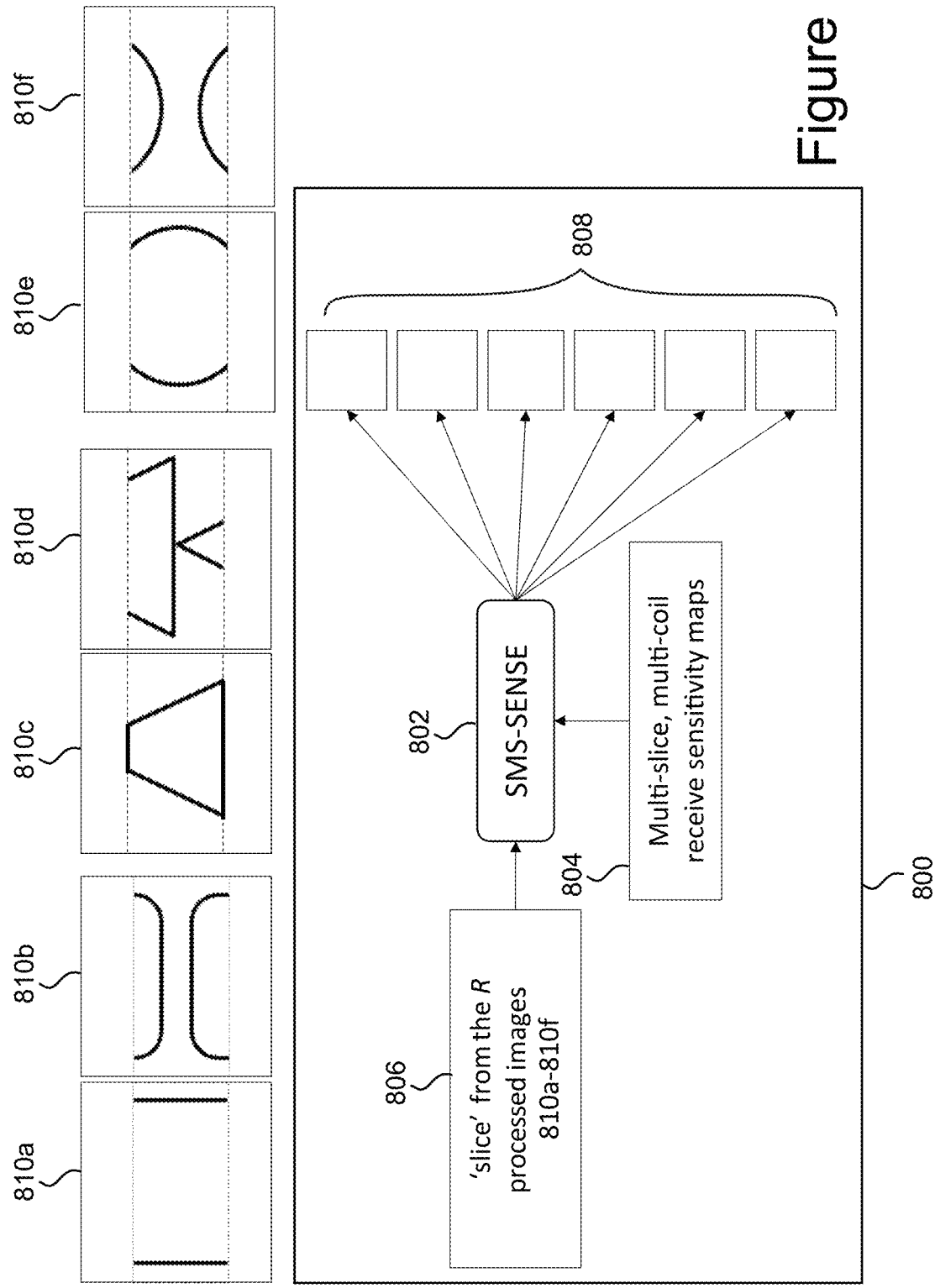
FIG. 8 is a schematic illustration of a further example use of reconstruction according to SENSE with SMS according to some example embodiments.

FIG. 8 schematically illustrates determining inter-slice leakage according to some example embodiments, when a combination of SMS and in-plane accelerated imaging is being used to acquire MR images. Images 810a-810f are processed (e.g., processed to obtain a reduced FOV by cropping out areas outside of the respective reduced FOV as it pertains to each image) input images for all the slices in an SMS 3× and in-plane accelerated imaging 2λ, which yields an acceleration R of 6. Each pair of images 810a-b, 810c-d and 810e-f (corresponding to images of a square, a triangle and a circle, respectively), include a main reduced FOV image (e.g., the mid part of the triangle in 810c) and an image of the fold over (e.g., the top/bottom parts of the triangle in 810d) caused by the in-plane acceleration.

In embodiments using a combination of SMS and in-plane accelerated imaging, the SENSE un-aliasing matrix is set up to un-alias MR images acquired by a SMS MRI data acquisition sequence so that when the MR slice image data is input to the matrix a pass-through slice image and one or more extra slice images are produced. Slice leakage from an input slice to another slice of the ROI can be determined based on content of the extra slice images. Additionally, to accommodate the in-plane accelerated imaging, when the MR slice image data is input to the SENSE un-aliasing matrix, since each input MR slice image data is a reduced FOV image, the in-plane residual alias is also output as an image.

The SENSE un-aliasing matrix is set up for a total acceleration factor R which includes an SMS acceleration factor MB and an in-plane reduced FOV acceleration factor P such that R=MB*P. One slice of image domain MRI data is selected for input to the un-aliasing matrix configured to produce one pass-through image and R−1 inter-plane and/or in-plane leakage map images. Inter-plane and in-plane leakages (e.g., produced in the form of slice leakage and residual alias, respectively) are determined based on content of the R−1 leakage maps.

The process operates by selecting one of the 810a-810f as input image 806. Then, the input image 806 is processed in the SENSE reconstruction module 802. The SENSE reconstruction module 802 also takes as input multi-slice multi-coil receive sensitivity maps 804. The sensitivity maps may be constructed in the same manner as in the operations of FIGS. 5-7. The SENSE reconstruction module 802 too may operate in the same or substantially the same manner as modules 502 and 702, and is further described in relation to FIG. 9 below.

The output images 808 include a separate image for each slice and for each aliased area. For a total acceleration of R, output images include one pass-through image and (R−1) leakage maps.

Figure 9:
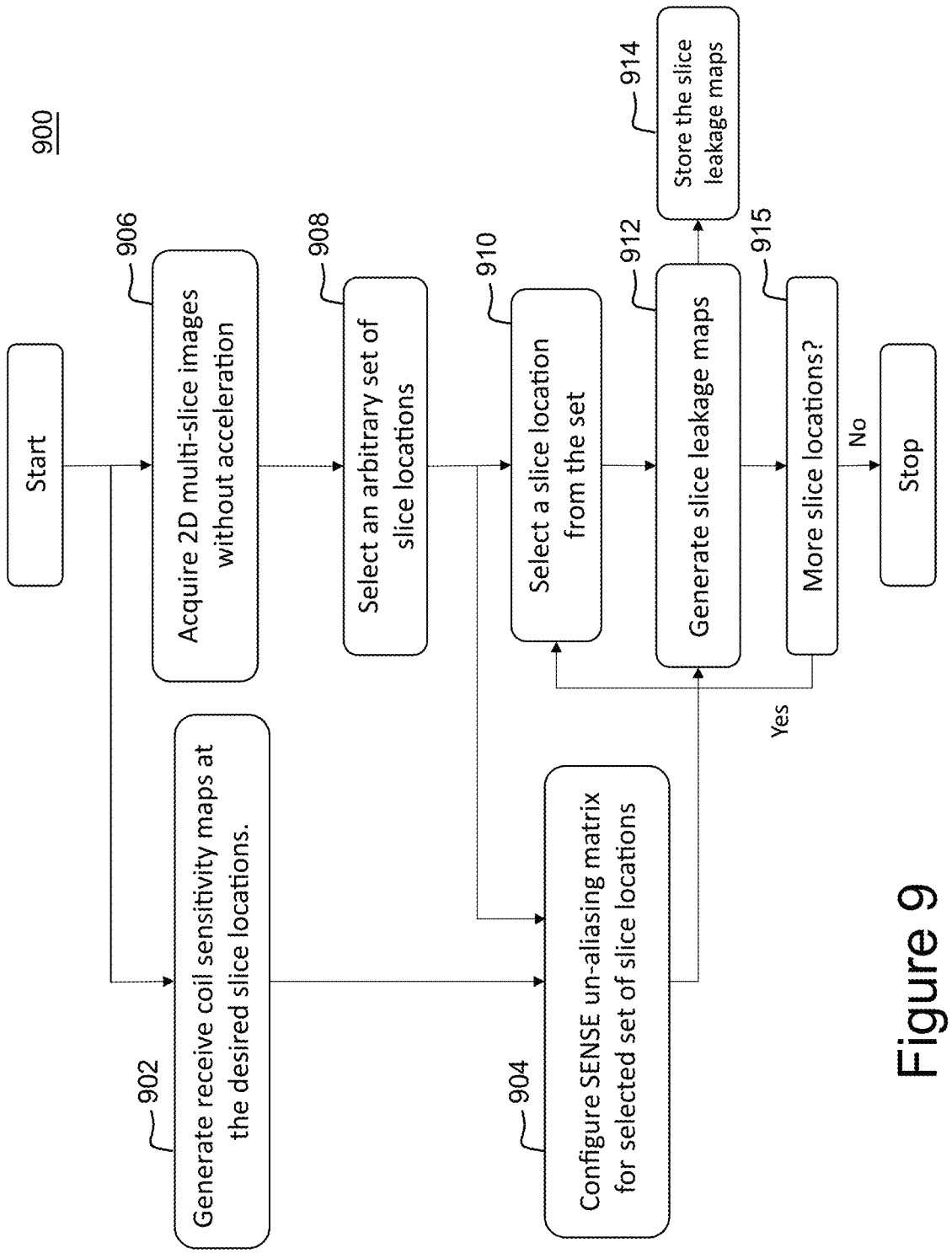
FIG. 9 illustrates a flowchart of a process for generating and storing slice leakage maps, in accordance with some example embodiments.

FIG. 9 illustrates a flowchart of a process 900 for generating and storing maps of slice leakage and/or in-plane residual alias, in accordance with some example embodiments. The embodiments may include some embodiments using SMS imaging (e.g., such as embodiment associated with FIG. 5-6), some embodiments using in-plane accelerated imaging (e.g., such as embodiment associated with FIG. 7), and some a combination of SMS and in-plane accelerated imaging (e.g., such as embodiment associated with FIG. 8).

After entering process 900, at operation 902, receive coil sensitivity maps at a selected plurality of slice locations are generated. Well known conventional techniques may be used to generate the coil sensitivity maps. In some example embodiments, sensitivity maps for each and every receive coil for each and every slice in the ROI is generated. However, some embodiments may not require all receive coils and/or all slices in the ROI to have corresponding coil sensitivity maps. Details for generating coil sensitivities are known (e.g., see Pruessmann K. P., et al., SENSE: Sensitivity encoding for fast MRI, Magnetic Resonance in Medicine, 42:952-962, 1999).

After generating the coil sensitivity maps, at operation 904, a SENSE un-aliasing matrix for at least the selected plurality of slice locations is generated. The SENSE un-aliasing matrix, according to some embodiments, is configured to have a number of rows and/or a number of columns that are more than the number of active receive coils (i.e., receive coils that actively receive MR signals) and the number of slices in the ROI, respectively. For example, if the configuration has 2 active receive coils and 2 slices in the ROI, the SENSE un-aliasing matrix can have more than 2 rows and/or more than 2 columns. Extra rows may be added to include pseudo-coils which encode some feature of the acquired images. For example, two-dimensional phase maps may be included as pseudo-coils to reduce ghosting artifacts in echo-planar MRI.

The additional rows and/or columns are defined to accommodate the aliases added to identify the leakage from the pass-through band to other bands. The "pass-through band", in relation to SMS imaging, refers to a slice in a patient's anatomy from which the primary MR signal is received, and in relation to in-plane imaging, refers to the area within the reduced FOV of the input image. The "other bands", in relation to SMS imaging, refer to other slices in a patient's anatomy, and in relation to in-plane imaging, refer to the areas outside the reduced FOV of the input image.

As described above, the reduced FOV and the areas outside the reduced FOV, for purposes of processing through the SENSE un-aliasing matrix and residual alias determination, are treated in example embodiments as respective slices. For example, the reduced FOV image of a slice and the image of the area outside the reduced FOV in that slice, are each provided as separate input images to the SENSE un-aliasing matrix, and, for each, a pass-through image and one or more in-plane residual alias images are output.

At operation 906, input images to the SENSE reconstruction module are obtained. The images may be acquired in a prescan, as part of the main imaging sequence (e.g., described in FIG. 10) or as a combination thereof.

In embodiments using SMS, 2D single slice images may be acquired with or without slice shifting as input images for the SENSE reconstruction module. In some embodiments, the 2D images are acquired simultaneously without shifting them in the in-plane direction so that they directly overlap on top of each other. But this may make it difficult to separate the slices if the receive coil sensitivity does not change substantially in the slice direction. To improve the quality of the reconstructed images, in some embodiments, the slices may be shifted during acquisition. This may be achieved by applying gradients that result in a linear phase ramp in k-space in the PE (phase encode) direction, which in turn causes the images to shift by a pre-defined factor. According to an example, when SMS 3× acceleration is used (see FIG. 5 and related description), three single slice image are used as input images.

In embodiments using in-plane accelerated imaging, the input images for the SENSE reconstruction module are obtained over the full field of view (FOV) that contains within it the entire ROI. That is, for example, when in-plane 2× acceleration is used (see FIG. 7 and related description), the half FOV image for the acquired FOV and the image including the portion of the FOV not present in the acquired FOV image are used as input to the SENSE un-aliasing.

In embodiments using SMS and in-plane accelerated imaging, the input images include an image for each slice subject to SMS, and, for each slice, reduced FOV images to cover the entire FOV. Images 810*a-f* described above with respect to FIG. 8 are an example.

At operation 908, a set of slice locations is selected from slices for which input images are available. The selection may be made arbitrarily. In example embodiments, the set of slice locations include all the slices in the ROI.

The process 900 may iterate operations 910-915 to generate slice leakage maps for each slice in the selected set, one by one. At operation 910, a slice location is selected from the set.

At operation 912, a slice leakage map is generated for the slice selected at operation 910. The slice leakage map for the selected slice may identify leakage from one or more other slices to the selected slice, and/or leakage from the selected slice to one or more other slices. The slice leakage map for the set of selected slices may be configured to map leakage from any arbitrary slice to any other arbitrary plurality of slices in the set of selected slices.

Slice leakage maps for SMS embodiments provide a mapping of inter-slice leakage from one slice to another, for in-plane accelerated imaging embodiments they provide a mapping of residual alias from one reduced FOV region to other such regions, and for combined SMS and in-plane accelerated imaging embodiments they provide for both inter-slice leakage and residual alias leakage. The output images of FIGS. 6, 7 and 8 illustrate examples of leakage map information for each of the above types of embodiments.

According to some example embodiments, the generation of the slice leakage map is independent of the type of acquisition sequence used to generate the images and is also independent of whether the slices were shifted or not by the imaging sequence used to acquire the processed images. In some embodiments, the processed images are generated from at least one MR imaging sequence using diffusion-weighted encoding magnetic gradient fields in at least one diffusion direction. Although the slice leakage maps according to embodiments can be generated for diffusion weighted images, which is a primary application for SMS, slice leakage maps according to embodiments are not limited thereto.

The acquisition acceleration parameters (e.g., R, reduced FOV acceleration P, and/or MB) may be configured by the operator. The configured value may specify that there is to be no acceleration, or some level of acceleration (e.g., up to the number of receive coils that can be simultaneously activated to receive MR signals).

In the SENSE reconstruction module, the output un-aliased images are obtained by multiplying the acquired aliased image with the inverse of the SENSE coil sensitivity matrix.

The SMS image acquisition and encoding process may be analytically represented as follows:

$$I = Cm \quad (\text{Eq. 1})$$

Where I is the vector of acquired accelerated image intensity values from all receive coils, C is the SENSE aliasing matrix, m is the vector of un-aliased image intensity values from all spatial locations that have aliased to form I. The above equation can be written in the full matrix-vector form as:

$$\begin{bmatrix} I_1(x,y) \\ I_2(x,y) \\ \vdots \\ I_{NC}(x,y) \end{bmatrix} = \quad (\text{Eq. 2})$$

$$\begin{bmatrix} C_{11}(x, y-y_1) & C_{12}(x, y-y_2) & \cdots & C_{1Ns}(x, y-y_{Ns}) \\ C_{21}(x, y-y_1) & C_{22}(x, y-y_2) & \cdots & C_{2Ns}(x, y-y_{Ns}) \\ \vdots & \vdots & \ddots & \vdots \\ C_{NC1}(x, y-y_1) & C_{NC2}(x, y-y_2) & \cdots & C_{NcNs}(x, y-y_{Ns}) \end{bmatrix}$$

$$\begin{bmatrix} m_1(x, y-y_1) \\ m_2(x, y-y_2) \\ \vdots \\ m_{Ns}(x, y-y_{2Ns}) \end{bmatrix}$$

Where Nc represents the number of coils indexed by i, Ns represents the number of slices indexed by j, $I_i$ represents the image acquired by coil i, $C_{ij}$ represents receive sensitivity of coil i for slice j, $m_j$ represents the un-aliased image intensity of slice j, and $y_j$ represents the slice shift ($y_j=0$ for all j when slices are not shifted).

The vector of un-aliased image intensity values can be reconstructed by analytically solving the above equation to get $$m=(C^{\dagger}C+\lambda\Gamma)^{-1}C^{\dagger}I \quad \text{(Eq. 3)}$$

Where $\lambda$ is the weight of Tikhonov regularizer (optional), $\Gamma$ is the identity matrix, and $\dagger$ is the Hermitian transpose operator.

In some cases, an analytic solution may not be possible. For example, when non-linear k-space trajectories are used to acquire accelerated MR data, it is common to use an iterative solver to solve the SENSE equation. Such solvers start with an initial guess of the un-aliased image intensity values and iteratively solve the SENSE equation to converge to a clean un-aliased image.

At operation 914, the slice leakage map is stored for subsequent use. For example, the map may be stored in a memory such as memory 46.

At operation 915, it is determined whether more slice locations remain to be processed, and if yes, then the process 900 proceeds to operation 910. If no, then process 900 ends.

It should be noted that one or more operations 902-915 may be performed in an order different from that shown, or may not be performed. In some embodiments, one or more other operations may be performed in process 900. Also, operations 902-904, which generate the coil sensitivity map, may be performed before, after or in parallel with at least some of the other operations 906-910.

Figure 10:
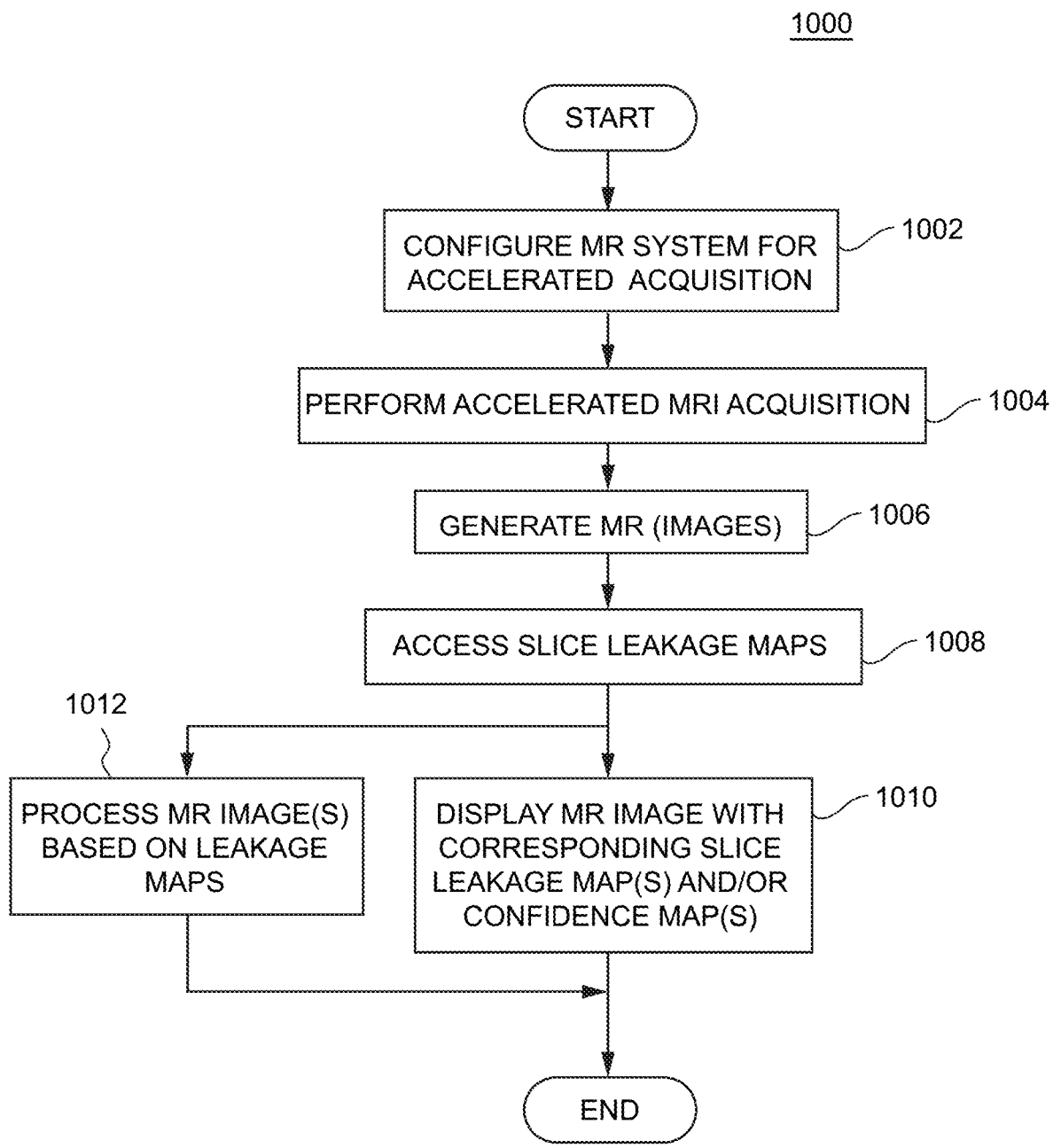
FIG. 10 illustrates a flowchart of a process for identifying and/or removing inter-slice leakage in displayed MRI images, in accordance with some example embodiments.

FIG. 10 illustrates a flowchart of a process 1000 for determining and/or alleviating inter-slice leakage in displayed MRI images, in accordance with some example embodiments.

After entering process 1000, at operation 1002, the MR system is configured for MR image acquisition using slice acceleration (e.g., SMS), in-plane acceleration (e.g., SENSE) or a combination of slice acceleration and in-plane acceleration.

At operation 1004 the MR system performs MR image acquisition using slice acceleration, in-plane acceleration or a combination thereof in a diagnostic scan (also referred to as the main scan).

At operation 1006, one or more synthesized/processed images are generated from the diagnostic scan. In embodiments where the diagnostic scan is based on SMS, each synthesized image is a composite of a plurality of slices obtained as a result of the diagnostic scan.

At operation 1008, slice leakage maps are accessed. One method of generation and storage of slice leakage map information was described above in relation to process 900 above.

After this operation, process 1000 may proceed either to process reconstructed images obtained from the main scan, based on leakage maps at operation 1012, or to display reconstructed images along with the corresponding slice leakage maps at operation 1010.

At operation 1010, for example, one or more images from the main scan and one or more images from the generated slice leakage are displayed simultaneously on the same display screen, or in closely located displays. By simultaneously displaying a diagnostic image of a slice, and at least an appropriate portion (e.g., a portion of the map that includes the selected slice) of the slice leakage map, the radiologist or other operator is provided with the capability to do side-by-side comparison. As further described below, in some embodiments, a confidence value or the like may be associated with each image in order provide guidance to the operator regarding presence of leakage artifacts and the like.

At operation 1012, the slice leakage maps may be processed to extract one or more spatial locations of inter-slice signal leakage and an amount of that leakage. The extracted information can be used to further process a selected diagnostic image in order to reduce the visible effects of leakage.

It will be understood that one or more operations 1002-1012 of process 1000 may not be performed or may be performed in a different order than shown, in some embodiments. Some embodiments may include one or more additional operations in process 1000.

In an example embodiment, processes 900 and 1000 may be implemented in the system shown in FIG. 1. More specifically, the generation of coil sensitivity maps, acquiring of 2D multi-slice images without acceleration, and the acquisition of MR images with acceleration may be performed by the MRI system controller 22, MRI sequence controller 30 and MRI data processor in communication and coordination with each other, and with other components of the systems 10 and 20. During processing of processes 900 and 1000, the generated slice leakage map(s) may be stored in a memory such as memory 46 for accessing during display on display 24, and/or further processing to reduce leakage artifacts in displayed diagnostic MR images.

Figure 11:
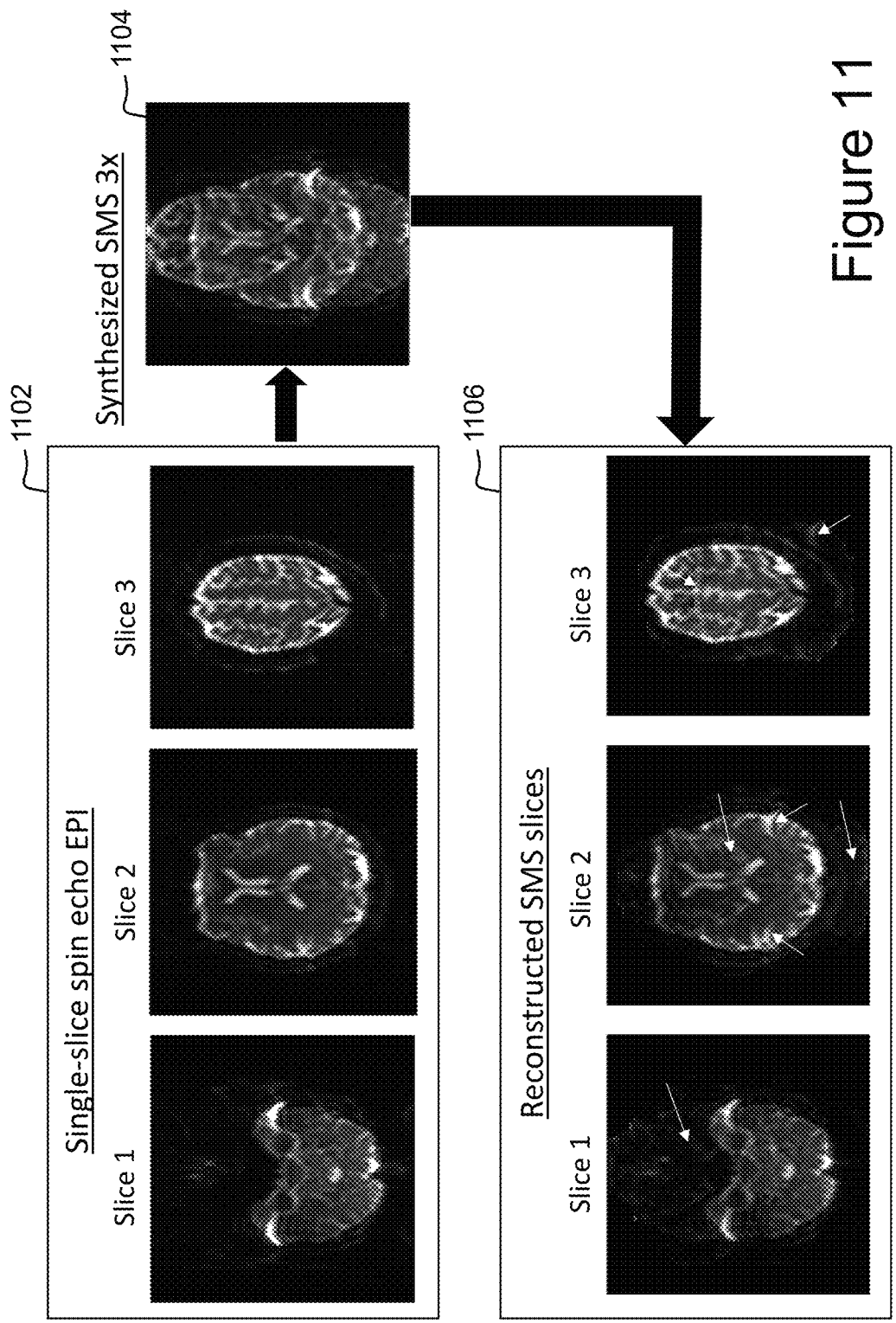
FIG. 11 illustrates example leakage artifacts in reconstructed SMS images.

FIG. 11 illustrates example leakage artifacts in reconstructed SMS images. Images 1102 are 32-channel single-slice 2D spin echo EPI images of three slices of a patient's brain. Images 1102 were combined in simulation to synthesize SMS 3× image 1104. Before synthesizing, the slices were shifted by FOV/3, 0, −FOV/3 units respectively, then summed. This was achieved by applying a PE phase ramp in k-space that corresponds to the desired shift followed by direct summation and Fourier transform. SENSE reconstruction was performed on the synthesized image 1104. The reconstructed SMS slices 1106 show leakage artifacts, pointed to by arrows. In this case, the primary source of leakage is distortion of the main images. Image distortion causes a mismatch of coil sensitivity values between the main scan and the coil sensitivity measurement pre-scan. In the human head, such distortions are primarily seen near air-tissue interfaces such as the frontal cortex and the auditory canal. As can be seen in the reconstructed SMS slices 1106, most of the slice leakage artifacts originate from these anatomical regions.

Figure 12:
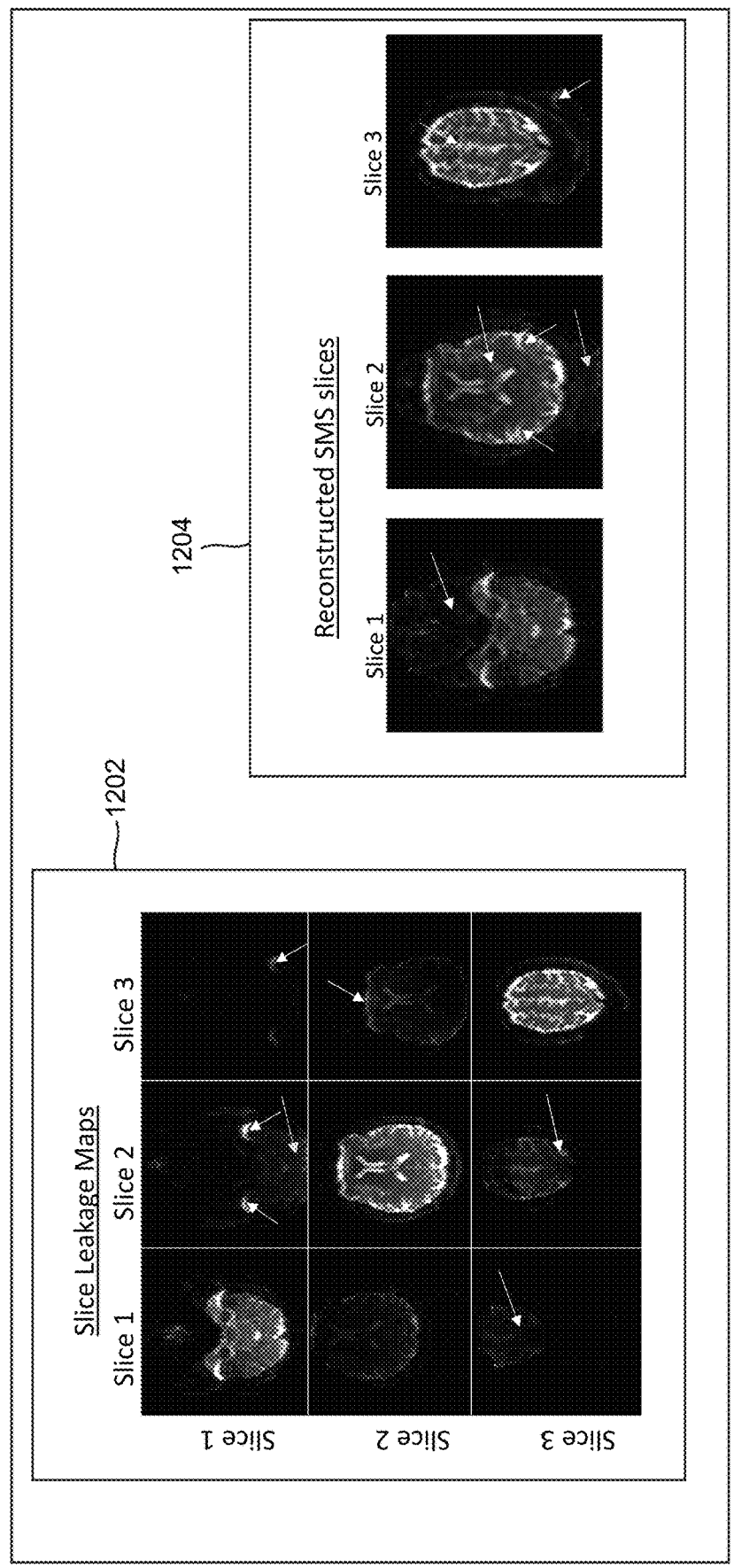
FIG. 12 illustrates slice leakage maps and reconstructed SMS images with leakage identified, in accordance with some example embodiments.

FIG. 12 illustrates slice leakage maps 1202 and reconstructed SMS images 1204 with leakage identified, in accordance with some example embodiments. Map matrix 1202 shows the estimated slice leakage maps for the SMS 3× example shown in FIG. 11. For row m & column n, image S(m,n) shows the leakage from slice m to slice n. The diagonal images, where m=n, represent the pass-through signal from a slice to itself. Ideally, if there is no leakage then all non-diagonal images will have 0 intensity. Row m shows how image intensities from slice m is distributed among all the slices represented in the map matrix. Column n shows all slices (i.e. slices represented in the map matrix) that contribute image intensity to slice n.

Slices that are spatially further apart have higher receive sensitivity difference and hence lower leakage. For example, S(1,3) shows lower leakage because slice 1 is far from slice 3.

By comparing the reconstructed SMS slices 1204 and the leakage maps 1202, the sources of slice leakage can be localized. The artifacts can each be individually identified/classified as slice leakage or true pathological state.

As noted above, some embodiments described herein provide an image domain parallel imaging based technique to identify slice leakage in simultaneous multi-slice imaging. The identified slice leakage may be used for assisting in more accurate distinguishing of pathologies in multi-slice MR images. Some embodiments may utilize the identified slice leakage in correcting the acquired MRI images.

To the inventors' knowledge the embodiments are the first image domain parallel imaging based technique to identify slice leakage in SMS imaging and to correct slice leakage by actively removing slice leakage using image-based reconstruction such as, for example, SENSE.

The conventional techniques to identify slice leakage in simultaneous multi-slice imaging have many disadvantages. The conventional Monte Carlo approach is time consuming. That technique takes on the order of hundreds of iterations to obtain accurate slice leakage maps. The conventional Slice-GRAPPA technique is k-space based, and the use of such a technique in some MR devices require substantial modifications and other overheads.

Image domain parallel imaging reconstruction, such as SENSE, is more prone to strong local leakage artifacts than k-space based reconstruction (e.g., Slice-GRAPPA). Any misregistration of voxels between the map scan (e.g., prescan for coil sensitivity maps) and main scan (e.g., the diagnostic scan) can potentially cause slice leakage.

In order to correctly characterize the leakage artifacts, if the main scan uses image domain technique (in-plane accelerated imaging such as SENSE), then slice leakage measurement should also use an image domain technique. Image domain and k-space methods are sensitive to different sources of mismatch between the main and pre-scans which can cause leakage. For example, k-space methods are very sensitive to image contrast differences between the main and pre scans which can lead to slice leakage. Image domain methods are largely immune to such sources. Therefore, in order to correctly characterize slice leakage originating from a reconstruction pipeline that uses an image domain method, slice leakage measurements should be performed in the image domain. For example, MR systems such as Canon Medical SMS imaging products uses in-plane accelerated imaging, and would efficiently incorporate an image domain (also referred to as "image space") technique for leakage determination. The embodiments use image domain parallel imaging reconstruction to identify and/or measure slice leakage artifacts. In general, the techniques of the embodiments can be used to measure residual aliasing in images with slice, in-plane or combined acceleration.

Some embodiments apply to both blipped- and non-blipped SMS acquisition. Embodiments apply to SMS images with or without in-plane accelerated imaging. Some embodiments provide for in-plane accelerated imaging without SMS, and/or to SMS and in-plane accelerated imaging.

In some example embodiments, the leakage maps can be used in conjunction with g-factor maps, which provide estimates of SNR distribution in an area, to assess SMS image quality.

In some example embodiments, the slice leakage maps can be quantified. For example, the normalized mean image intensity in each slice leakage map can be computed to find relative contribution of each slice to all other slices. A confidence map which, for example, provides a confidence value for each slice, generated based on the respectively associated signal leakage determined by the un-aliasing matrix may be formed, and may be displayed together or in association with the display of diagnostic images.

Some example embodiments may be used in slice leakage mitigation techniques. For example, slice leakage maps can be used as input to systems to be used in the calculation of optimal SMS sequence parameters to force any leakage to fall outside the region-of-interest.

K-space based methods have been conventionally proposed to mitigate inter-slice leakage artifacts. Example k-space based mitigation techniques include Split slice-GRAPPA (Cauley et al, "Interslice Leakage Artifact Reduction Technique for Simultaneous Multislice Acquisitions", MRM 72:93-102, 2014), and SMS-HSL (Park et al, "SMS-HSL: Simultaneous Multislice Aliasing Separation Exploiting Hankel Subspace Learning", MRM 78:1392-1404, 2017).

Slice-GRAPPA (described above) is an early k-space based method to reconstruct SMS images. It exploits the linear dependencies between neighbouring k-space signals across all coils. The GRAPPA kernel is trained on single slice calibration images, and the kernel is applied on SMS k-space to generate k-space data for the separated slices. The slice-GRAPPA kernel behaves as a filter in that it should only allow signal from the slice-of-interest to pass through. Split slice-GRAPPA extends the filter concept in that the stop-bands of the filter are designed to suppress signal from all the slices outside the slice-of-interest. This is achieved by training the split slice-GRAPPA kernel to minimize signal contribution from the other slices.

SMS-HSL extends the split slice-GRAPPA technique and casts SMS reconstruction as a non-convex optimization problem with three terms. The data fidelity term comprises a direct magnitude prior between the reference data and the reconstructed single-slice imaging data (e.g., at the locations where the low resolution reference data was acquired). Inter-slice leakage is reduced by minimizing the l2-norm between the acquired SMS data and the sum of all the calibration k-space data from slices other than the slice-of-interest, in what is known as Hankel space. Further, a low-rank constraint is added on the reconstructed single-slice data in Hankel space.

Conventional split slice-GRAPPA and SMS-HSL techniques and the like may be sensitive to contrast differences between the calibration data and the main imaging data. For example, SMS-HSL cannot be applied to diffusion imaging because of the magnitude prior in k-space. Moreover, split slice-GRAPPA and SMS-HSL use priors in k-space to suppress unknown slice leakage. Thus, these conventional techniques may not adequately correct leakage in MRI images acquired using acceleration techniques. In such techniques there is typically a tradeoff, where higher levels of suppression of slice leakage also results in a concomitant loss in other aspects of image fidelity.

The example embodiments for correcting slice leakage are, in contrast to the conventional split slice-GRAPPA and SMS-HSL techniques, not sensitive to contrast differences between reference and main imaging data. Moreover, in contrast to the use of priors in k-space in conventional techniques to suppress the unknown slice leakage, in example embodiments directly measured inter-slice leakage maps are used in an analytic SENSE expression. Therefore, images are reconstructed by the example embodiments with reduced inter-slice leakage artifacts using a completely deterministic and exact linear transform, and do not require sacrifices in image fidelity.

Moreover, some conventional techniques are designed to deal with SMS correction and improvement in cases where "autocalibration" (e.g., such as ACS lines in GRAPPA) is used. These autocalibrated methods use the central region of k-space more than once (e.g., twice), resulting in k-space errors propagating to images in a way which is not linear and thus difficult to model and/or correct.

Errors arising in conventional non-linear scans and reconstructions may not be suitable for measuring and modeling with a linear transfer function or a matrix multiplication. For example, in such conventional techniques, errors are often measured with a second order statistic, like RMS magnitude deviations, using a large number of Monte Carlo model repetitions. This type of conventional technique therefore yields a statistical sense of the error magnitude (at each location), but not the sign or phase of that error. Thus, these conventional corrections are limited in practice to some penalty based on expected error magnitude, and cannot fully eliminate the error, as the error term phase is unknown.

Certain example embodiments herein now provide new methods and systems for correcting inter-slice leakage in accelerated MRI, when leakage can be measured. In some example embodiments, leakage may be measured in accordance with techniques described in relation to FIG. 9 above. Indeed, techniques described in relation to FIG. 9 are particularly synergistic with leakage correction in example embodiments because leakage maps output by the technique of FIG. 9 (e.g., such as, for example, leakage maps for viewing by an operator) can themselves be input to the leakage correction realized in example embodiments. In some other example embodiments, however, leakage is measured by techniques different from that described in relation to FIG. 9.

The effectiveness of example embodiments at correcting slice leakage may, at least to some extent, be dependent on the availability of high quality, complex-valued inter-slice leakage maps.

The new leakage correction technique used in some example embodiments makes use of magnitude and phase of a multiplicative error matrix (at each location). This provides for exact and complete removal of leakage error (of course subject to accuracy and validity of a leakage measurement step). Further, since the error model is a linear matrix, inversion and correction are computationally fast.

Example embodiments actively remove or correct slice leakage, as can occur in SMS MRI (or in in-plane accelerated imaging, or in SMS plus SENSE). The inventors are not aware of any existing techniques which actively remove slice leakage in SMS acquisitions using image-based reconstructions such as SENSE.

Example embodiments provide corrected MRI images by incorporating the leakage maps into the SENSE equation, followed by an inversion and multiplication with the acquired aliased image values. Before the leakage maps can be used in the SENSE equation they are converted into quantitative, normalized, complex-valued "fractional leakage matrix". A given spatial location in the fractional leakage matrix corresponds to the relative magnitude and phase of the signal contribution to that spatial location from all the un-aliased slices. The fractional leakage matrix is incorporated into the SENSE equation by casting the leakage information into the form of a linear transformation, i.e. a matrix multiplication with complex coefficients. Thereafter, an inverse (or pseudoinverse) of that "fractional leakage matrix" is formed. A reconstruction which is the composition of two matrix inversions—i.e. the "normal inversion" of the intended (ideal) forward encoding of the SMS or in-plane accelerated imaging acquisition is then performed followed by inversion of the "fractional leakage matrix" in order to obtain a leakage-corrected MRI image.

In example embodiments, the same correction techniques are applied to MRI images acquired with pure SMS, pure in-plane accelerated imaging or joint SMS plus SENSE.

Figure 13:
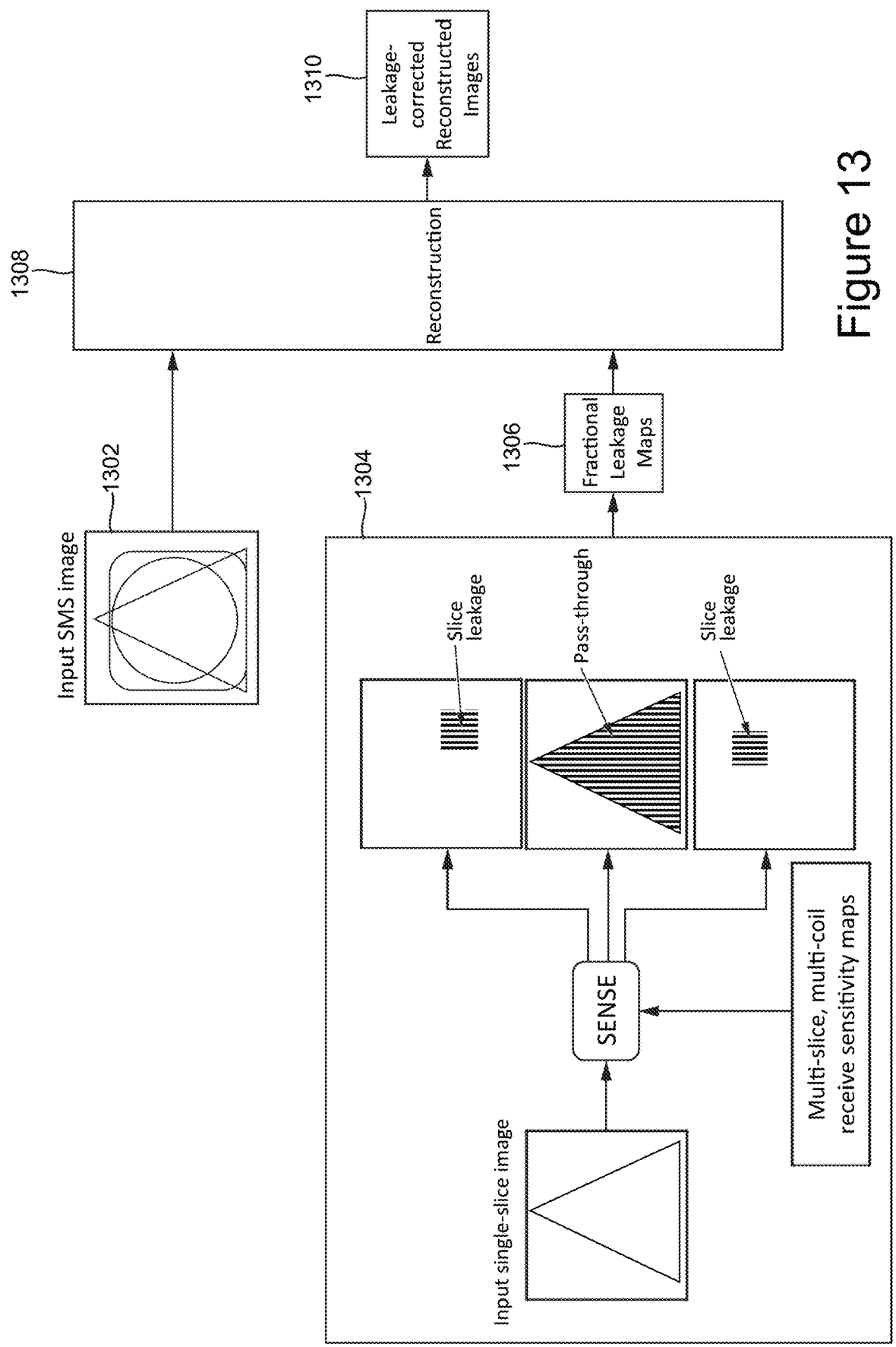
FIG. 13 illustrates a schematic illustration of the leakage correction and corrected image generation according to certain example embodiments.

FIG. 13 illustrates a schematic illustration of leakage correction and corrected image generation according to certain example embodiments.

An MRI image 1302 acquired using accelerated MRI is used as input to a reconstruction process 1308. In the illustrated example, input MRI image 1302 is acquired using SMS MRI imaging.

The reconstruction process 1308 additionally takes as input leakage maps 1306 that represent inter-slice leakage. The leakage maps 1306 may be constructed based upon measured inter-slice leakage. The leakage maps 1306 may be generated in accordance with a slice leakage measurement technique such as those described in this disclosure. In the example shown, the slice leakage measurement technique described above in relation to FIG. 6 is used to generate slice leakage maps that are used in generating fractional leakage matrices 1306 which, as stated above, contain complex coefficients accommodating both magnitude and phase. However, in some other embodiments, other techniques for measuring slice leakage may be used for the leakage maps.

Receiving input uncorrected MRI image 1302 and leakage matrices 1306, reconstruction process 1308 operates to output a corrected MRI image 1310 in which leakage has been eliminated or reduced. The reconstruction may include, forming an inverse (or pseudoinverse) of the fractional leakage matrix, and then performing a reconstruction by multiplying by the composition of two inverse matrices in order to obtain a leakage-corrected MRI image.

By making use of phase and magnitude of a multiplicative error matrix at each location, example embodiments provide for exact and complete removal of leakage error.

Slice leakage correction according to some embodiments may be incorporated in MR systems such as, but not limited to, the above mentioned Canon Medical SMS imaging product which uses image domain parallel imaging reconstruction.

As can be seen in the discussion of FIG. 13 above, example embodiments for slice leakage correction generate a fractional leakage matrix and use it in a reconstruction that includes compositions of two matrices or two inverse matrices. The generation of the fractional leakage matrix and the improved image reconstruction process with leakage correction are further described below in relation to FIG. 14.

However, before the leakage correction techniques used in example embodiments are described in further detail below, an analytical formulation of the problem is described. The formulation is described in parts in the contexts of in-plane accelerated imaging and SMS. However, persons of skill in the art will understand that although the pulse sequences for the respective techniques are not identical among SMS, in-plane accelerated imaging and joint SMS plus SENSE techniques, the analytical formulation of the problem for pure SMS, pure in-plane accelerated imaging and joint SMS plus SENSE may be similar to each other.

Image reconstruction in SENSE (Pruessmann, see above) can be analytically formulated as follows.

If aliased pixels "p" or "p(i)" are encoded by receive coils with sensitivity σ, then after FFT reconstruction some aliased coil channels images "$c_j$" (each coil channel is spatially aliased, in a primary phase encode direction, or a 3D slice phase encode direction, or both) are obtained $$c_j = \sigma_{ji} * p_i \quad \text{(Eq. 4)}$$

where i={1, R} and j={1, Nc}. R is the acceleration factor or the number of aliases (slices), and "Nc" is the number of coils or the number of input parallel channels. The values $\sigma_{ji}$ of a sensitivity matrix may be experimentally determined, for example, but not limited to, techniques such as that with an independent prescan data acquisition and data processing.

Then, the reconstruction problem can be posed as the recovery of reconstructed pixels "r" by using a linear matrix transform "u". "u" is the "unfolding matrix" also known as the "un-aliasing matrix".

$$r_i = u_{ij} * c_j \quad \text{(Eq. 5)}$$

Thus, to obtain reconstructed pixels "r", an algorithm is required to determine values of the "u" matrix.

By substituting equation 4 into equation 5, $$r_i = u_{ij} * \sigma_{ji} * p_i \quad \text{(Eq. 6)}$$

Thus, the recovery of $r_i$ requires $$u_{ij} * \sigma_{ji} = I \quad \text{(Eq. 7)}$$

Schematically, Equation 7 requires that $$u_{ij} = (\sigma_{ji})^{-1} \quad \text{(Eq. 8)}$$

That is, the unfolding matrix required in the recovery of the reconstructed pixels r can be derived as the inverse of the sensitivity matrix, which, as noted above, can be experimentally determined.

However, equation 8 does not have a single technical solution. The problem is in most instances overdetermined because Nc>R, i.e. there are more coils than acceleration. Therefore, instead of seeking a perfect fit (which may be unachievable in practical circumstances), example embodiments are designed to achieve a kind of "least squares fit", for example, by taking into account penalty terms or preferences for certain a-priori model assumptions regarding the images, etc. Many techniques are usable for determining the least square fit. A good classical choice is the Moore-Penrose pseudoinverse technique. Optionally the Moore-Penrose pseudoinverse may be used with a noise correlation matrix, or Tikhonov regularization, or both. Other algorithms and "solutions" are also feasible, such as, for example, SVD (singular value decomposition) with some kind of cutoff threshold on the eigenvalues. These may yield the following approaches to determine the unfolding matrix:

$$u_{ij} = [\sigma^\dagger \sigma]^{-1} \sigma^\dagger \quad \text{(Eq. 10)}$$

or $$u_{ij} = [(\sigma^\dagger \Psi^{-1} \sigma)]^{-1} \sigma^\dagger \Psi^{-1} \quad \text{(Eq. 11)}$$

or $$u_{ij} = [(\sigma^\dagger \sigma) + \lambda I]^{-1} \sigma^\dagger \quad \text{(Eq. 12)}$$

or $$u_{ij} = [(\sigma^\dagger \Psi^{-1} \sigma) + \lambda I]^{-1} \sigma^\dagger \Psi^{-1} \quad \text{(Eq. 13)}$$

Where $\Psi$ is the Nc×Nc receiver noise correlation matrix which represents how the noise from one receiver correlates with noise from another receiver, and the superscript t indicates the Hermitian transpose operation.

In SENSE, the R related pixels are aliased because the phase encode spacing is too sparse, and the unambiguous Nyquist band in image space is larger than the prescribed FOV.

In SMS, the R related pixels are encoded nominally the same by imaging encoding gradients, but there is a multiplicity of excited slices because of multiband frequency content in the RF transmit excitations. When "good" RF excitation patterns are assumed (or otherwise slice excitation variation is assumed to be "absorbed" into the shading of the pixels), then the encoding for SMS is structurally the same as for SENSE $$c_j = \sigma_{ji} * p_i \quad \text{(Eq. 14)}$$

and the basic reconstruction is therefore also the same as for SENSE $$r_i = u_{ij} * c_j \quad \text{(Eq. 15)}$$

Equations 14 and 15 in the context of SMS are the same as equations 5 and 6 in the context of SENSE. However, in SMS, successive excitations may include blipped gradient waveforms in the slice direction which apply PE phase modulation for various slice locations, in addition to the nominal phase encode gradients used in conventional in-plane accelerated imaging.

In practical implementations, however, there is some kind of error in the encoding and/or the decoding of the SMS related pixels. Such errors may arise because of many reasons. For example, the actual encoding "a" which happens when slices are excited may not be the same as measured a; measured a might be explicitly erroneous (inaccurate), or there might even be some other unaccounted-for encoding effect (such as, for example, imperfections in the transmit RF profiles); there may have been physical changes between when a was measured and when SMS encoding acquisition occurred (e.g., patient motion, motion of the RX coil, or general system drift error); the main SMS acquisition may have different geometric distortion error relative to acquisition of the sigma measurement (corresponding pixel locations in these two images might not really both come from the exact same physical location); and various filtering or interpolation or extrapolation of sigma maps may introduce biases or errors, etc.

Therefore, in SMS, assuming that there is some error in available coil-and-slice encodings, and with "$\sigma f_{ji}$" representing a "flawed" sensitivity matrix (i.e., sensitivity matrix that includes errors), pixels can be represented as $$r_i = u f_{ij} * \sigma f_{ji} * p_i \quad \text{(Eq. 16)}$$

where $u f_{ij}$ is "normal" reconstruction or unfolding performed according to a standard manner (e.g., unfold without correcting for inter-slice leakage errors) to invert the "$\sigma f_{ji}$" matrix as is.

When the estimated $\sigma f_{ji}$ is incorrect, slice leakage and residual aliasing artifacts are observed in the reconstructed SMS images. In order to perform an accurate reconstruction in the presence of a flawed $\sigma f_{ji}$, a quantitative map of the slice leakage, which was earlier described as the "fractional leakage matrix", is needed. One of the techniques to measure the leakage matrix is based on single-excited slice values. Single-excited slice MRI signal values can be obtained by successively "turning off" the multiband aspect of the excitation for all but one slice location at a time during acquisition. A technique of acquiring single-excited slice pixel values was described above in relation to FIG. 9.

These acquired single-excited slice images $a_{pq}$ can be run through "the normal SMS reconstruction", and when one slice at a time is excited (or in in-plane accelerated imaging, instead of SMS, excite one band of unaliased pixels), reconstruction of the other slices is performed as if they had been excited. Ideally this would yield $$a_{pq} = \delta_{pq} * p_q \quad \text{(Eq. 17)}$$

i.e., "on the diagonal"

$$a_{qq} = p_q \quad \text{(Eq. 18)}$$

and "off-diagonal"

$$a_{qt} = 0 \text{ (when } q \neq t\text{)} \quad \text{(Eq. 19)}$$

If the measurement of $\sigma_{ji}$ is accurate (e.g., if the measured value accurately reflects the respective coil sensitivities), and if the inversion to form $u_{ij}$ is accurate, then $\delta_{pq}$ in Equation 18 would be the kronecker delta function.

But due to errors, leakage is encountered $$a_{qt} \neq 0 (\text{when } q \neq t)) \quad \text{(Eq. 20)}$$

and shading errors are encountered $$a_{qq} \neq p_q \quad \text{(Eq. 21)}$$

When the original "normal reconstruction matrix" is multiplied onto the single-slice excited acquisitions, and the reconstructed "test images" $t_{il}$ are computed, results including leakage and shading are observed.

$$t_{il} = u_{ij} * \sigma_{jk} * a_{kl} \quad \text{(Eq. 22)}$$

or $$t_{ij} = u_{ij} * \sigma_{jk} * \delta_{kl} * p_l \quad \text{(Eq. 23)}$$

In Equation 23, however, $\delta_{kl}$ no longer is the ideal kronecker delta, but rather it can be considered to depict empirical "fractional leakage" as non-zero off-diagonal terms, and "fractional shading" as diagonal terms other than 1.

Formulated this way, $\delta_{kl}$ can be considered as a linear transformation, which takes ideal images (e.g., images without leakage artifacts), and transforms them into the empirical flawed images. This linear transformation may be referred to as a fractional leakage matrix and/or leakage matrix linear transformation.

To obtain an improved and corrected reconstruction (i.e. corrected "to first order") from such flawed images, example embodiments utilize a better reconstruction "$b_{ik}$", $$b_{ik} = v_{ij} * uf_{jk} \quad \text{(Eq. 24)}$$

where the $uf_{jk}$ is the "normal" (e.g., flawed and/or without correcting for leakage) reconstruction, and the $v_{ij}$ is another inverse matrix, as will be specified below, and which can be applied so as to "invert" the leakage matrix transformation.

The "$uf_{jk}$" can be considered as the "normal reconstruction unfolding" which is intended to invert sensitivity encoding, and "$v_{ij}$" can be considered as a "second order unfolding" which is intended to invert residual aliasing error of the leakage matrix, as measured by, for example only and without limitation, techniques described above in relation to single-slice excitations and/or FIG. 9.

Then, presuming that a substantially accurate "$v_{ij}$" can be determined, its application will result in final or fixed reconstructed pixels "$z_w$", with "w" being an index over the aliases. This reconstruction can be applied to either normally acquired SMS aliased images (Eq. 25), or to single-slice excited test images (Eq. 26), as appropriate.

$$z_w = v_{wi} * uf_{ij} * c_j \quad \text{(Eq. 25)}$$

$$z_w = v_{wi} * uf_{ij} * \sigma_{jk} * \delta_{kl} * p_l \quad \text{(Eq. 26)}$$

The test image pixel $t_{ik}$ (see Equations 22 and 23) can be factored into a plausibly correct term $x_{ij}$ (e.g., correct to within simple scaling or shading or static phase errors but no aliased leakage signal), and a slice-to-slice fractional leakage term $\varepsilon_{ij}$.

The value for $\varepsilon_{ij}$ is close to 1 on the diagonal (e.g., if not much shading error happened, and $x_{ij} \approx p_i$), or it is exactly 1 on the diagonal (e.g., if the definition of $x_{jk}$ includes absorbing any unfolding-shading).

$$t_{ik} = \varepsilon_{ij} * x_{jk} \quad \text{(Eq. 27)}$$

An efficient and simple technique to achieve this in example embodiments, but not the only technique that can be used, is to rescale columns in matrix $t_{ik}$ by the diagonal term in each column. This rescaling is also called "normalization", and has the significant benefit that $\varepsilon_{ij}$ no longer depends upon the MRI contrast of specific tissues.

For example, column 2 of the matrix (here for example, just for clarity, R=4 has been presumed)

$$\begin{bmatrix} \cdot & t12 & \cdot & \cdot \\ \cdot & t22 & \cdot & \cdot \\ \cdot & t32 & \cdot & \cdot \\ \cdot & t42 & \cdot & \cdot \end{bmatrix} \quad \text{(Eq. 28)}$$

can be divided by the diagonal term t22, yielding $$\begin{bmatrix} \cdot & \varepsilon 12 & \cdot & \cdot \\ \cdot & 1.0 & \cdot & \cdot \\ \cdot & \varepsilon 32 & \cdot & \cdot \\ \cdot & \varepsilon 42 & \cdot & \cdot \end{bmatrix} = \begin{bmatrix} \cdot & t12/t22 & \cdot & \cdot \\ \cdot & 1.0 & \cdot & \cdot \\ \cdot & t32/t22 & \cdot & \cdot \\ \cdot & t42/t22 & \cdot & \cdot \end{bmatrix} \quad \text{(Eq. 29)}$$

where elements $\varepsilon_{ij}$ and $t_{ij}$ are complex numbers. Similar normalization is performed on all columns, of course.

Note that $\varepsilon_{ij}$ has a meaning which is highly analogous to the $\delta_{kl}$ from Equation 23, with the distinction that $\delta_{kl}$ is the fractional leakage of the main accelerated uncorrected images, while $\varepsilon_{ij}$ is a measured fractional leakage. We may think of $\delta_{kl}$ as a previously unknown quantity or a quantity which cannot be determined from the main accelerated images, and we may think of $\varepsilon_{ij}$ as some measurement or estimate of the same quantity (perhaps acquired in some embodiments using single slice full FOV test images.)

The new leakage correction matrix v is a suitable inverse or pseudoinverse of the fractional leakage $\varepsilon_{ij}$.

$$v = [\varepsilon^\dagger \varepsilon]^{-1} \varepsilon^\dagger \quad \text{(Eq. 30)}$$

Equation 30 may be modified to accommodate some regularization etc., as desired and/or needed.

Then the improved or "better" reconstruction matrix $b_{ik}$, from Equation 24, becomes:

$$b = \varepsilon^{-1} * uf \quad \text{(Eq. 31)}$$

or $$b = [t_{ij}/t_{jj}]^{-1} * uf \quad \text{(Eq. 32)}$$

or $$b = [[t_{ij}/t_{jj}]^\dagger [t_{ij}/t_{jj}]]^{-1} [t_{ij}/t_{jj}]^\dagger * [\sigma^\dagger \sigma]^{-1} \sigma^\dagger \quad \text{(Eq. 33)}$$

Equations 31, 32 and 33 each depict successively more explicit and more detailed versions of the improved (and/or better) reconstructions. It is further permissible to insert regularization etc. in any of Equations 31-33 to decrease noise gain at the cost of potentially sacrificing some fidelity, and it is also further permissible to insert the noise correlation inverse matrix $\Psi^{-1}$, etc., consistently with the teachings of this disclosure.

Figure 14:
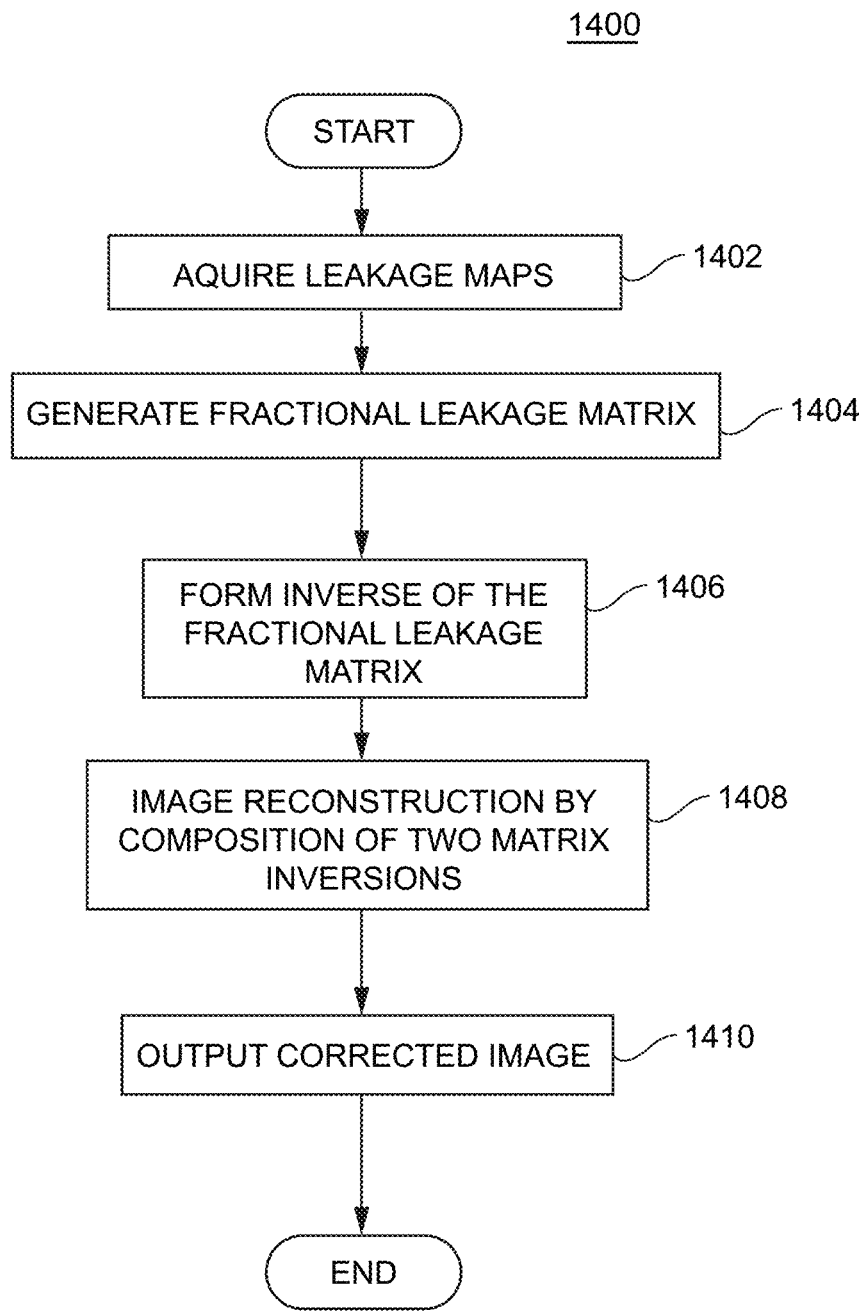
FIG. 14 illustrates a method for correcting inter-slice leakage, according to some example embodiments.

FIG. 14 provides a flowchart of the example improved and/or better reconstruction process 1400. The improved and/or between reconstruction process performed in accordance with certain example embodiments provide improved reconstructed images in which leakage artifacts have been either eliminated or at least substantially reduced, when compared to a reconstruction that does not remove inter-slice leakage.

After process 1400 is entered, at operation 1402, inter-slice leakage maps are acquired. In certain example embodiments, inter-slice leakage maps are representative of actual measured inter-slice leakage. The inter-slice leakage maps may be acquired from a memory such as memory 46 or the like. The inter-slice leakage maps may be generated by a process such as the process described in relation to FIG. 9. FIG. 6 schematically illustrates the generation of inter-slice leakage maps using SENSE reconstruction, according to some example embodiments. The input to the SENSE reconstruction process in FIG. 6 is a single-slice excited image— that is an image obtained in response to exciting only a single slice. As shown in FIG. 6, and as described in more detail in relation to FIG. 6, SENSE reconstruction of a single-slice excited image may provide a demultiplexing of the single-slice excited image thus yielding a pass-through image containing the signal in the excited slice and leakage images for one or more other slices. The leakage images correspond to the signal contributions to the single-slice excited image from other slices and/or aliased locations. Example inter-slice leakage maps, arranged in the form of a slice leakage map matrix 1202, are shown in FIG. 12.

Equations 17-23 above analytically characterize single-slice excited images that can be used to generate the inter-slice leakage maps, according to some example embodiments.

At operation 1404, a fractional leakage matrix is generated from the acquired leakage maps. As described above, a fractional leakage matrix may be an R×R matrix (R being the number of aliases, and the total acceleration factor). The fractional leakage matrix may be based upon the inter-slice leakage maps. For example, each element in the fractional leakage map may directly correspond to a leakage measurement at a particular pixel in a leakage map. For example, according to an example embodiment, a fractional leakage matrix may be formed for each pixel position i in an image of slice j. Each value in the fractional leakage matrix for pixel position i may correspond to a respective signal contribution received at the pixel position i from each slice j in the acquisition, as determined from the inter-slice leakage maps. The elements of the fractional leakage matrix may include complex coefficients quantifying both magnitude and phase of the respective image pixels.

According to some example embodiments, the fractional leakage matrix can optionally be normalized before being subjected to further processing. Normalization can be performed by, for each column of the matrix, dividing each value by the corresponding diagonal element. For example, in the matrix column shown in Equation 29, each element in the column is divided by the diagonal element t22. Ideally, this would result in the diagonal elements being exactly one, but this may not necessarily be the case. A value different from 1 in a matrix normalized as described in this paragraph may represent that the corresponding pixel is affected by some estimated amount of shading.

In some other embodiments, the normalizing can be performed by other techniques. For example, some embodiments may, instead of dividing just by the diagonal term, divide by the square root of sum of squares of all of the image pixel values in the column of the fractional leakage matrix.

At operation 1406, an inverse of the fractional leakage matrix is generated. The inverting of the fractional leakage matrix stored in the memory may be performed in accordance with matrix algebra operations. An example inversion, according to some embodiments, is shown in Equation 30.

At operation 1408, image reconstruction is performed by composition of two matrix inversions. According to some example embodiments, the reconstruction can be performed in accordance with any of the Equations 31-33. The reconstruction performed in this operation results in improved reconstructed images in which artifacts due to the inter-slice leakage have either been completely eliminated or is substantially reduced when compared to images reconstructed without leakage correction.

At operation 1410, the corrected MRI image is output. The corrected MR image may have entirely eliminated the inter-slice leakage error or may at least have substantially reduced artifacts due to such errors as compared to images reconstructed without leakage correction. The output may be transmitted to one or more displays for immediate observation by an operator or clinician. In some embodiments, the output images can be stored in a digital storage memory.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) image domain method for processing MRI images reconstructed from k-space MRI data acquired from multiple magnetic resonance (MR) radio frequency (RF) signal receiving coils having respectively associated known RF signal reception sensitivity fields, MR signal contributions from each slice having been de-multiplexed from a plurality of multiplexed slices or aliased locations in reconstructed image domain MRI data to be processed, said method comprising:

forming, in a digital memory connected to at least one processor, a linear transformation representing said MR signal contributions from each multiplexed slice or aliased location into other slices or locations;

inverting the linear transformation formed in the digital memory; and generating, using the at least one processor, one or more improved SENSE reconstructed images of respective ones of said plurality of slices or locations having reduced MR signal contributions between slices or locations by a composition of the one or more SENSE reconstructed MRI images and the inverted linear transformation; and outputting the generated one or more improved reconstructed images to a display or digital storage.

2. The MRI image domain processing method as in claim 1 wherein the linear transformation is a matrix of complex-valued inter-slice signal leakage measurements.

3. The MRI image domain processing method as in claim 2, wherein the inter-slice leakage measurements in the linear transformation are column-wise normalized prior to the inverting such that respective values on a diagonal of the matrix are each equal to or near to 1.

4. The MRI image domain processing method as in claim 2, wherein the inter-slice leakage measurements in the linear transformation are column-wise normalized prior to the inverting by dividing values of a respective column with a square root of sum of squares of all values in the column.

5. The MRI image domain processing method as in claim 2, wherein the inter-slice leakage measurements in the linear transformation are obtained from MRI image domain data corresponding to respective single-slice excited acquisitions.

6. The MRI image domain processing method as in claim 5, wherein the single-slice excited acquisitions are performed in an MRI pre-scan data acquisition sequence prior to a main MRI diagnostic scan data acquisition sequence or as part of the main MRI diagnostic scan data acquisition sequence.

7. The MRI image domain processing method as in claim 1, wherein the linear transformation comprises a matrix of elements such that non-zero values of off-diagonal elements of the matrix correspond to inter-slice leakage measurements and values of diagonal elements of the matrix correspond to shading.

8. The MRI image domain processing method as in claim 1, wherein the generating comprises multiplying one of the reconstructed MRI images by the inverted linear transformation.

9. The MRI image domain processing method as in claim 1, wherein the reconstructed MRI images are generated by unfolding the k-space MRI data using a sensitivity matrix corresponding to said RF signal receiving coils.

10. The MRI image domain processing method as in claim 1, further comprising:
  accessing, prior to said demultiplexing, MRI image domain data nominally representing at least one slice of a region of interest (ROI);
  processing said one slice of accessed MRI image domain data by input to a sensitivity encoding (SENSE) un-aliasing matrix built from predetermined RF signal reception sensitivity maps for multiple RF MR signal receiving coils used to acquire MRI data to be processed, thereby producing as matrix output SENSE-decoded MRI image domain data for one pass-through image slice and at least one extra slice; and
  determining inter-slice leakage and/or in-plane residual aliasing based on content of said at least one extra output slice from the SENSE-decoded MRI image domain data,
  wherein the linear transformation is formed based on the determined inter-slice leakage and/or in-plane residual aliasing.

11. The MRI image domain processing method as in claim 10 wherein:
  said un-aliasing matrix is set up to un-alias MR images acquired by a simultaneous multi-slice (SMS) MRI data acquisition sequence so that when the MR slice image data is input to the matrix at least one extra slice image is produced, and
  slice leakage from an input slice to another slice of the ROI is determined based on content of said at least one extra slice image.

12. A magnetic resonance imaging (MRI) apparatus comprising:
  static and gradient magnetic field generators and a plurality of radio frequency (RF) coils disposed within said magnetic field generators, the RF coils having respectively associated known RF signal reception sensitivity fields;
  RF transmitter and RF receiver circuits coupled to said RF coils; and
  an MRI sequence controller including a k-space memory and at least one processor configured to control said magnetic field generators and said RF transmitter and receiver circuits to:
  reconstruct MRI image domain data from k-space MRI data acquired from said RF coils, MR signal contributions from one slice having been de-multiplexed from a plurality of multiplexed slices or aliased locations in reconstructed image domain MRI data;
  form, in a digital memory connected to the at least one processor, a linear transformation representing said MR signal contributions from each multiplexed slice or aliased location into other slices or locations;
  invert the linear transformation formed in the digital memory;
  generate, using the at least one processor, one or more improved SENSE reconstructed images of respective ones of said plurality of slices or locations having reduced MR signal contributions between slices or locations by a composition of the one or more SENSE reconstructed MRI images and the inverted linear transformation; and
  output the generated one or more improved reconstructed images to a display or digital storage.

13. The MRI apparatus according to claim 12, wherein said at least one processor is further configured to form the linear transformation to include a matrix of complex-valued inter-slice signal leakage measurements.

14. The MRI apparatus according to claim 13, wherein said at least one processor is further configured to column-wise normalize the inter-slice leakage measurements in the linear transformation prior to the inverting such that respective values on a diagonal of the matrix are each equal to or near to 1.

15. The MRI apparatus according to claim 13, wherein said at least one processor is further configured to column-wise normalize the inter-slice leakage measurements in the linear transformation prior to the inverting by dividing values of a respective column with a square root of sum of squares of all values in the column.

16. The MRI apparatus according to claim 12, wherein said at least one processor is further configured to obtain the inter-slice leakage measurements in the linear transformation from MRI image domain data corresponding to respective single-slice excited acquisitions.

17. The MRI apparatus according to claim 16, wherein said at least one processor is further configured to perform the single-slice excited acquisitions in an MRI pre-scan data acquisition sequence prior to a main MRI diagnostic scan data acquisition sequence or as part of the main MRI diagnostic scan data acquisition sequence.

18. The MRI apparatus according to claim 12, wherein said at least one processor is further configured to generate the improved reconstructed images by multiplying one of the reconstructed MRI images by the inverted linear transformation.

19. The MRI apparatus according to claim 12, wherein said at least one processor is further configured to:
  access, prior to said demultiplexing, said MRI image domain data nominally representing at least one slice of a region of interest (ROI);
  process said one slice of accessed MRI image domain data by input to a sensitivity encoding (SENSE) un-aliasing matrix built from predetermined RF signal reception sensitivity maps for multiple RF MR signal receiving coils used to acquire MRI data to be processed, thereby producing as matrix output SENSE-decoded MRI image domain data for one pass-through image slice and at least one extra slice; and determine inter-slice leakage and/or in-plane residual aliasing based on content of said at least one extra output slice from the SENSE-decoded MRI image domain data, wherein the linear transformation is formed based on the determined inter-slice leakage and/or in-plane residual aliasing.

20. A non-transitory computer readable storage medium having stored therein instructions that, when executed by a computer processor having access to memory and said stored instructions, causes the computer to perform a magnetic resonance imaging (MRI) image domain operations for processing MRI images reconstructed from k-space MRI data acquired from multiple magnetic resonance (MR) radio frequency (RF) signal receiving coils having respectively associated known RF signal reception sensitivity fields, MR signal contributions from one slice having been de-multiplexed from a plurality of multiplexed slices or aliased locations in reconstructed image domain MRI data to be processed, wherein the operations include:

forming, in a digital memory connected to at least one processor, a linear transformation representing said MR signal contributions from each multiplexed slice or aliased location into other slices or locations;

inverting the linear transformation formed in the digital memory; generating, using the at least one processor, one or more improved SENSE reconstructed images of respective ones of said plurality of slices or locations having reduced MR signal contributions between slices or locations by a composition of the one or more SENSE reconstructed MRI images and the inverted linear transformation; and outputting the generated one or more improved reconstructed images to a display or digital storage.

* * * * *